(12) United States Patent
Masuyama et al.

(10) Patent No.: US 8,946,842 B2
(45) Date of Patent: Feb. 3, 2015

(54) METHOD FOR MANUFACTURING OPTICAL WAVEGUIDE RECEIVER AND OPTICAL WAVEGUIDE RECEIVER

(71) Applicant: Sumitomo Electric Industries, Ltd., Osaka-shi, Osaka (JP)

(72) Inventors: Ryuji Masuyama, Kamakura (JP); Yoshihiro Yoneda, Isehara (JP); Hideki Yagi, Machida (JP); Naoko Inoue, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 14/017,708

(22) Filed: Sep. 4, 2013

(65) Prior Publication Data

US 2014/0070351 A1    Mar. 13, 2014

(30) Foreign Application Priority Data

Sep. 7, 2012  (JP) ................................. 2012-197596

(51) Int. Cl.
*H01L 31/0232* (2014.01)
*H01L 21/00* (2006.01)
*G02B 6/00* (2006.01)
*G02B 6/42* (2006.01)

(52) U.S. Cl.
CPC ...... *H01L 31/02325* (2013.01); *H01L 31/0232* (2013.01); *G02B 6/42* (2013.01)
USPC ............................. 257/432; 385/12; 438/69

(58) Field of Classification Search
CPC ..................... H01L 31/02325; H01L 31/0232; H01L 31/042; G02B 6/42; G02B 6/02
USPC .............. 257/432, 431, 462, 728; 385/12, 14, 385/123; 438/29, 31, 69
See application file for complete search history.

(56) References Cited

U.S. PATENT DOCUMENTS

| | | | |
|---|---|---|---|
| 5,539,848 A * | 7/1996 | Galloway | 385/89 |
| 7,012,274 B2 * | 3/2006 | Taylor | 257/12 |
| 7,423,254 B2 * | 9/2008 | Arend et al. | 250/214.1 |
| 8,467,637 B2 * | 6/2013 | Fujikata et al. | 385/14 |
| 2002/0033979 A1 * | 3/2002 | Dair et al. | 359/152 |
| 2002/0097962 A1 * | 7/2002 | Yoshimura et al. | 385/50 |
| 2011/0243491 A1 * | 10/2011 | Hashimoto | 385/3 |
| 2012/0148184 A1 * | 6/2012 | Yoneda et al. | 385/2 |
| 2012/0237153 A1 * | 9/2012 | Weimann et al. | 385/1 |
| 2012/0270347 A1 * | 10/2012 | Yagi | 438/31 |

FOREIGN PATENT DOCUMENTS

JP         2007-180425 A      7/2007

* cited by examiner

*Primary Examiner* — Nikolay Yushin
(74) *Attorney, Agent, or Firm* — Smith, Gambrell & Russell, LLP

(57) ABSTRACT

A method for manufacturing an optical waveguide receiver includes the steps of growing first and second stacked semiconductor layer sections, the second stacked semiconductor layer section including a core layer and a cladding layer; forming a first mask including first and second portions; etching the first and second stacked semiconductor layer sections by using the first mask, the first and second stacked semiconductor layer sections covered with the first portion being etched in a mesa structure, the second stacked semiconductor layer section covered with the second portion being etched in a terrace-shaped structure; removing the second portion from the first mask with the first portion left; selectively etching the cladding layer until exposing a surface of the core layer; and sequentially forming a first metal layer, an insulating film, and a second metal layer on the core layer exposed in the step of selectively etching the cladding layer.

8 Claims, 17 Drawing Sheets

METHOD FOR MANUFACTURING OPTICAL WAVEGUIDE RECEIVER AND OPTICAL WAVEGUIDE RECEIVER

BACKGROUND OF THE INVENTION

1. Field of the Invention

The present invention relates to a method for manufacturing an optical waveguide receiver and an optical waveguide receiver.

2. Description of the Related Art

Japanese Unexamined Patent Application Publication No. 2007-180425 discloses a semiconductor device. The semiconductor device includes a photodiode and capacitor disposed on a common substrate. The capacitor includes an n-type indium gallium arsenide (InGaAs) layer, a silicon nitride (SiN) layer disposed on the n-type InGaAs layer, a metal layer which is disposed on the SiN layer and which is made of titanium/platinum/aluminum (Ti/Pt/Au), an SiN layer disposed on the metal layer, and a metal layer which is disposed on this SiN layer and which is made of Ti/Pt/Au. The n-type InGaAs layer, which is included in the capacitor, is composed of a semiconductor layer common to the photodiode.

In recent years, optical waveguide receivers including a photodiode and optical waveguide integrated on a semiconductor substrate have been investigated. Such an optical waveguide receiver is used in high-speed optical communications having a high bit rate of, for example, 40 Gb/s or more. In particular, the optical waveguide receiver is used as a receiver front-end for a digital coherent communication system. The digital coherent communication system is an optical transmission system that combines a multi-level modulation technique with a digital coherent receiver technique. The optical waveguide receiver is manufactured by forming a butt-joint structure on a semiconductor substrate. In the butt-joint structure, a stacked semiconductor layer section constituting a photodiode and a stacked semiconductor layer section constituting an optical waveguide are butt-jointed with each other. An optical absorption layer including the stacked semiconductor layer section constituting the photodiode is optically coupled with a core layer including the stacked semiconductor layer section constituting the optical waveguide.

SUMMARY OF THE INVENTION

The optical waveguide includes a capacitor disposed between a reference potential line (GND line) and a bias line for applying a bias voltage to the photodiode. For the downsizing of a receiver front-end, the capacitor is preferably disposed on the semiconductor substrate along with the photodiode and the optical waveguide. The capacitor is preferably a metal-insulator-metal (MIM) capacitor including two metal layers and an insulating layer interposed therebetween.

However, when an MIM structure is formed on the semiconductor substrate in forming the optical waveguide receiver, there is a problem below. In the MIM structure formed on the semiconductor substrate, in order to achieve uniform characteristics such as breakdown voltage distribution in the wafer plane, a surface of the semiconductor substrate has to be flat. However, in general, surfaces of semiconductor substrates are not flat and have certain roughness. Thus, when the MIM structure is directly formed on the semiconductor substrate, it is difficult to achieve uniform breakdown voltage distribution under the influence of the surface roughness of the semiconductor substrate.

Furthermore, irregularities are formed on a surface of the semiconductor substrate during a process. For example, in an optical waveguide receiver having a buried structure in which both side faces of a mesa-shaped optical waveguide are embedded with a buried layer, a surface of the buried layer grown on the semiconductor substrate has a large number of protrusions called hillocks. Even if the buried layer on the semiconductor substrate is removed by etching, the many hillocks are not etched off but remain on a surface of the semiconductor substrate. Alternatively, when the buried layer on the semiconductor substrate is removed by etching, the hillocks serve as etching masks and the pattern thereof is transferred to the semiconductor substrate, thereby causing irregularities on the semiconductor substrate. Therefore, when the MIM structure is formed on the substrate after removing the buried layer, the MIM structure is formed on the substrate having a non-flat surface due to the hillocks.

A semiconductor layer epitaxially grown on the semiconductor substrate generally has a flatter surface as compared to a surface of the semiconductor substrate. Therefore, for example, a semiconductor buffer layer is grown on the semiconductor substrate to obtain a surface flatter than the substrate surface. Thus, in the semiconductor buffer layer formed on the semiconductor substrate, it is conceivable that a region where the MIM structure is to be formed is protected with mask so that the MIM structure is formed on the semiconductor buffer layer having the flatter surface. However, the region where the MIM structure is to be formed has a large size of, for example, 100 µm×300 µm. Therefore, such a method causes deposits on the mask when the stacked semiconductor layer sections for the photodiode and the optical waveguide are grown. As a result, the deposits impair the flatness of the surface of the semiconductor buffer layer on which the MIM structure is formed. Furthermore, the mask is not removed because the deposits formed on the mask serve as an etching mask.

A method for manufacturing an optical waveguide receiver according to the present invention includes the steps of growing a first stacked semiconductor layer section for a light-receiving element and a second stacked semiconductor layer section for an optical waveguide on a substrate, the first stacked semiconductor layer section including an optical absorption layer, the second stacked semiconductor layer section including a core layer and a cladding layer disposed on the core layer; forming a first mask which includes a first portion covering portions of the first and second stacked semiconductor layer sections and a second portion covering a portion of the second stacked semiconductor layer section in which a capacitor is formed; etching the first and second stacked semiconductor layer sections by using the first mask, the first and second stacked semiconductor layer sections covered with the first portion being etched in a stripe-shaped mesa structure, the second stacked semiconductor layer section covered with the second portion being etched in a terrace-shaped structure; removing the second portion from the first mask with the first portion left; selectively etching the cladding layer covered with the second portion until exposing a surface of the core layer; and sequentially forming a first metal layer, an insulating film, and a second metal layer on the core layer exposed in the step of selectively etching the cladding layer, the first metal layer, the insulating film, and the second metal layer constituting the capacitor.

In the method, the second stacked semiconductor layer section covered with the second portion of the first mask is etched in the terrace-shaped structure. Subsequently, the cladding layer covered with the second portion is selectively etched, whereby a surface of the core layer is exposed. Thereafter, an MIM capacitor including the first metal layer, the insulating film, and the second metal layer is formed on the core layer. In this case, the core layer serves as a base for the capacitor.

In the method, the capacitor is formed on the core layer grown on the substrate. In general, a surface of a semiconductor layer grown on a substrate is flatter as compared to a surface of the substrate. Therefore, a flat base face of the capacitor (the MIM structure) is obtained, and the capacitor is formed on the flat base face which is the surface of the core layer.

In the method, the core layer may be made of a semiconductor material different from that of the cladding layer disposed on the core layer. In addition, in the step of selectively etching the cladding layer, the cladding layer may be etched with an etchant having an etching rate of the cladding layer higher than an etching rate of the core layer. In the method, the core layer is preferably made of a semiconductor material different from that of another layer (an upper cladding layer) of the second stacked semiconductor layer section. Furthermore, the use of an etching method in which the etching rate of the core layer is different from that of another layer (an upper cladding layer) enables a flat surface of the core layer to be readily exposed.

In the method, the core layer may be made of indium gallium arsenide phosphide (InGaAsP) or aluminum gallium indium arsenide (AlGaInAs). The cladding layer may be made of indium phosphide (InP). In addition, in the step of selectively etching the cladding layer, the cladding layer is preferably etched by wet etching using an etching solution containing hydrochloric acid as the etchant. This allows a flat surface of the core layer to be exposed well by making use of the difference in etching rate between InP and InGaAsP or AlGaInAs.

In the method, the core layer exposed in the step of selectively etching the cladding layer preferably has a surface roughness of 0.05 μm or less.

The method further includes the steps of forming a second mask on a side face and a top face of the mesa structure including the second stacked semiconductor layer section after removing the second portion from the first mask; and selectively growing a buried layer on a side face of the mesa structure including the first stacked semiconductor layer section and a top face and a side face of the terrace-shaped structure using the first and second masks. In addition, in the step of selectively etching the cladding layer, the buried layer and the cladding layer may be selectively etched using a mask having an opening located above the cladding layer covered by the second portion of the first mask. Furthermore, in the step of selectively growing a buried layer, the buried layer may be grown by supplying a dichloroethylene gas with a source gas.

An optical waveguide receiver according to the present invention includes a light-receiving element; an optical waveguide including a core layer, the optical waveguide being optically coupled to the light-receiving element; and a capacitor electrically connected between a reference potential line and a bias line for supplying a bias voltage to the light-receiving element. The light-receiving element, the optical waveguide, and the capacitor are integrated on a substrate. The capacitor includes a base layer, a first metal layer disposed on the base layer, an insulating film disposed on the first metal layer, and a second metal layer disposed on the insulating film. In addition, the base layer of the capacitor is a portion of a semiconductor layer grown for forming the core layer of the optical waveguide.

In the optical waveguide receiver, the capacitor includes the base layer, which is a portion of the semiconductor layer grown for forming the core layer of the optical waveguide, and an MIM structure including the first metal layer, insulating film, and second metal layer disposed on the base layer. In general, a surface of a semiconductor layer grown on a substrate is flatter as compared to a surface of the substrate. In usual, the base layer, which is a portion of the semiconductor layer grown for forming the core layer, is made of a semiconductor material different from that of other layers of the optical waveguide. Thus, a flat surface of the base layer can be readily exposed by making use of, for example, the difference in etching rate between the base layer and the other layers. Accordingly, in the optical waveguide receiver, the capacitors (the MIM structures) have uniform characteristics (for example, breakdown voltage characteristics) because the capacitors are formed on the flat base face.

In the optical waveguide receiver, the core layer may be made of InGaAsP or AlGaInAs. The optical waveguide may further include a cladding layer disposed on the core layer, the cladding layer being made of InP.

DESCRIPTION OF THE PREFERRED EMBODIMENTS

Figure 1:
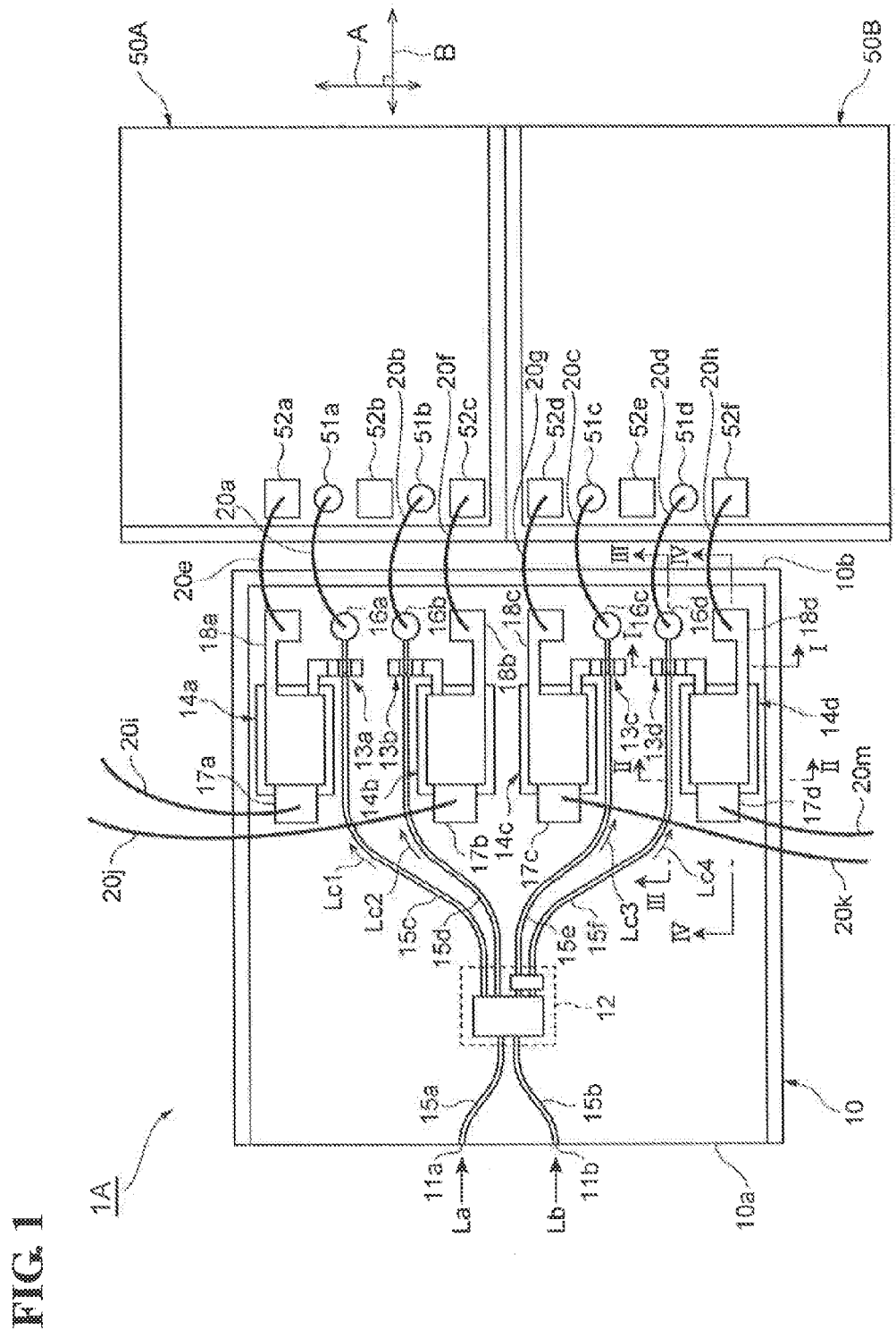
FIG. 1 is a plan view illustrating the configuration of an optical receiver including a multi-channel optical waveguide receiver according to an embodiment of the present invention.

Embodiments of a method for manufacturing an optical waveguide receiver and an optical waveguide receiver according to the present invention will now be described in detail with reference to the attached drawings. In the description of the drawings, the same components are given the same reference numerals and overlapping descriptions will be omitted.

Figure 2A:
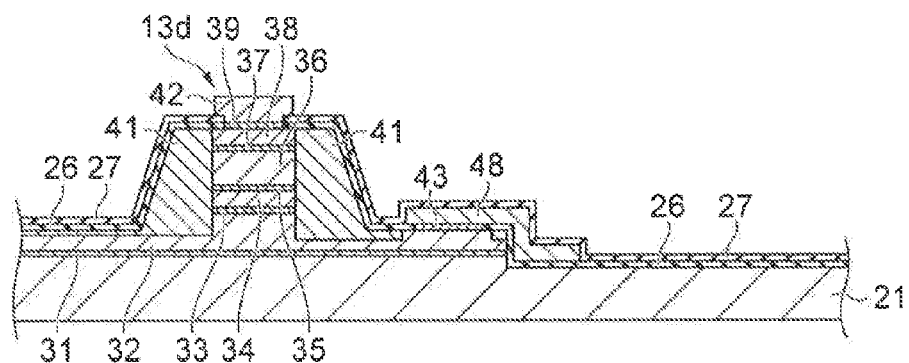
FIGS. 2A, 2B, 2C, and 2D are cross-sectional views taken along the lines I-I, II-II, III-III, and IV-IV, respectively, of FIG. 1.
Figure 2B:
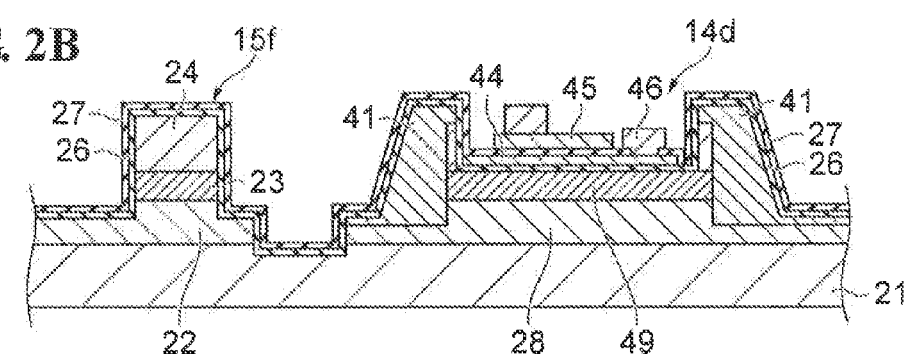
Figure 2C:
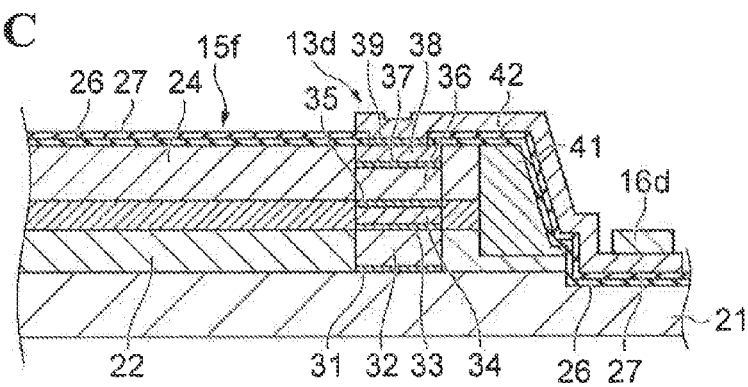
Figure 2D:
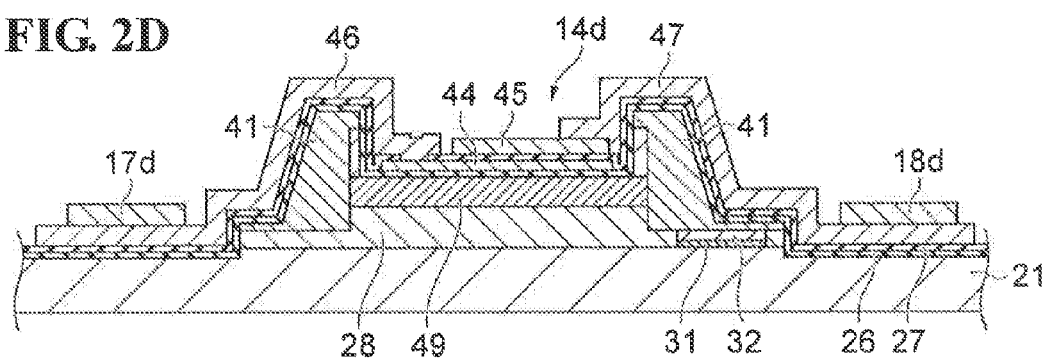

FIG. 1 is a plan view illustrating a configuration of an optical receiver including a multi-channel optical waveguide receiver (hereinafter simply referred to as "optical waveguide receiver") according to an embodiment of the present invention. FIG. 2A is a cross-sectional view taken along line I-I of FIG. 1. FIG. 2B is a cross-sectional view taken along line II-II of FIG. 1. FIG. 2C is a cross-sectional view taken along line III-III of FIG. 1. FIG. 2D is a cross-sectional view taken along line IV-IV of FIG. 1.

As illustrated in FIG. 1, the optical receiver 1A of the present embodiment includes an optical waveguide receiver 10 and signal amplifiers 50A and 50B. The optical waveguide receiver 10 has a substantially rectangular plane shape. The optical waveguide receiver 10 includes an optical waveguide provided on a semiconductor substrate, such as an indium phosphide (InP) substrate. The optical waveguide receiver 10 includes two optical input ports 11a and 11b and an optical branching unit (optical coupler) 12. The optical waveguide receiver 10 further includes first to fourth light-receiving elements 13a to 13d and first to fourth capacitors 14a to 14d formed on the semiconductor substrate.

The optical waveguide receiver 10 has a pair of edges 10a and 10b that extend in a first direction A. The two optical input ports 11a and 11b are located on one (edge 10a) of the edges 10a and 10b of the optical waveguide receiver 10. An optical signal La containing four signal components (first to fourth signal components) modulated by the quadrature phase-shift keying (QPSK) method is input from outside the optical receiver 1A to one (optical input port 11a) of the two optical input ports 11a and 11b. Local oscillator light Lb is input to the other optical input port 11b. The optical input ports 11a and 11b are optically coupled through optical waveguides 15a and 15b, respectively, to the optical branching unit 12. The optical waveguides 15a and 15b each suitably include a core and a cladding that covers the core. The core is made of a material (e.g., indium gallium arsenide phosphide (InGaAsP)) having a relatively high refractive index. The cladding is made of a material (e.g., InP) having a refractive index lower than that of the core.

The optical branching unit 12 forms a 90-degrees optical hybrid. That is, the optical branching unit 12 is formed by a multimode interference (MMI) coupler. The optical branching unit 12 causes the optical signal La and the local oscillator light Lb to interfere with each other. Thus, the optical branching unit 12 divides the optical signal La into four signal components Lc1 to Lc4 modulated by QPSK. Of the four signal components Lc1 to Lc4, the signal components Lc1 and Lc2 are in the same polarization state and have an in-phase relationship. The signal components Lc3 and Lc4 are in the same polarization state, which differs from that of the signal components Lc1 and Lc2. The signal components Lc3 and Lc4 have a quadrature relationship.

The light-receiving elements 13a to 13d each are composed of a PIN photodiode. The light-receiving elements 13a to 13d are arranged in this order along the edge 10b of the optical waveguide receiver 10. The light-receiving elements 13a to 13d are optically coupled through optical waveguides 15c to 15f, respectively, to respective four output ports of the optical branching unit 12. Constant bias voltages are supplied to respective cathodes of the light-receiving elements 13a to 13d. The light-receiving elements 13a to 13d receive the signal components Lc1 to Lc4, respectively, from the optical branching unit 12 and generate electrical signals (photocurrents) corresponding to respective optical intensities of the signal components Lc1 to Lc4. Electrode pads 16a to 16d for the outputs of the electrical signals are disposed on the optical waveguide receiver 10. The electrode pads 16a to 16d are electrically connected to anodes of the light-receiving elements 13a to 13d, respectively. The electrode pads 16a to 16d are arranged along the edge 10b of the optical waveguide receiver 10 in the direction A. The electrode pads 16a to 16d are electrically connected through bonding wires 20a to 20d to electrode pads 51a to 51d, respectively, of the signal amplifiers 50A and 50B.

The capacitors 14a to 14d each include a base layer made of a semiconductor, a first metal layer and a second metal layer stacked on the base layer, and an insulating layer interposed between the first and second metal layers. On the optical waveguide receiver 10, the capacitors 14a to 14d are arranged side by side with (or arranged adjacent to) the optical waveguides 15c to 15f, respectively, in the direction A. The capacitors 14a to 14d are electrically connected between the respective reference potential lines (GND lines) and bias lines for supplying bias voltages to the cathodes of the light-receiving elements 13a to 13d. That is, one of the first and second metal layers is connected to the bias line electrically connected to the cathode of each of the light-receiving elements 13a to 13d, and the other metal layer is connected to the reference potential line (GND line).

The capacitors 14a to 14d each include electrode pads 17a to 17d for applying bias voltage, respectively, connected to one of the first and second metal layers. The capacitors 14a to 14d further include electrode pads 18a to 18d connected to the other metal layer that is connected to the reference potential line (GND line). The electrode pads 18a to 18d are interposed between the electrode pads 17a to 17d, respectively, and the edge 10b of the optical waveguide receiver 10 in a second direction B that crosses the first direction A. The electrode pads 18a to 18d extend in the direction toward the edge 10b, whereas the electrode pads 17a to 17d extend in the direction away from the edge 10b.

Bonding wires 20i to 20m are connected at one end to the electrode pads 17a to 17d, respectively, and electrically connected at the other end to respective bias voltage sources (not shown). The bonding wires 20i to 20m form parts of wiring lines, respectively, that supply bias voltages to the light-receiving elements 13a to 13d, respectively.

Bonding wires 20e to 20h are connected at one end to the electrode pads 18a to 18d, respectively. The bonding wires 20e to 20h are disposed along the bonding wires 20a to 20d, respectively. The bonding wires 20e to 20h are connected at the other end to ground electrode pads 52a, 52c, 52d, and 52f, respectively, of the signal amplifiers 50A and 50B. The ground electrode pads 52a, 52c, 52d, and 52f are connected to the reference potential line (GND line), respectively.

The signal amplifiers 50A and 50B are amplifiers (preamplifiers) that amplify electrical signals (photocurrents) output from the light-receiving elements 13a to 13d. The signal amplifier 50A includes the electrode pads 51a and 51b to input electrical signals (photocurrents). The signal amplifier 50A is composed of a differential-amplifier which amplifies the electrical signals input to the electrode pads 51a and 51b to generate one voltage signal. The signal amplifier 50B includes the electrode pads 51c and 51d. The signal amplifier 50B is also composed of a differential-amplifier which amplifies the electrical signals input to the electrode pads 51c and 51d to generate one voltage signal. The electrode pads 51a to 51d are arranged in this order in the first direction A along the edge 10b of the optical waveguide receiver 10. As described above, the electrode pads 51a to 51d are electrically connected through the bonding wires 20a to 20d to the electrode pads 16a to 16d, respectively.

The signal amplifier 50A further includes the ground electrode pads 52a to 52c connected to the reference potential line (GND line), respectively. The ground electrode pads 52a to 52c are arranged in this order in the first direction A along the edge 10b of the optical waveguide receiver 10. The electrode pad 51a is interposed between the ground electrode pads 52a and 52b. The electrode pad 51b is interposed between the ground electrode pads 52b and 52c. Similarly, the signal amplifier 50B further includes the ground electrode pads 52d to 52f connected to the reference potential line (GND line), respectively. The ground electrode pads 52d to 52f are arranged in this order in the first direction A along the edge 10b of the optical waveguide receiver 10. The electrode pad 51c is interposed between the ground electrode pads 52d and 52e. The electrode pad 51d is interposed between the ground electrode pads 52e and 52f. As described above, the ground electrode pads 52a, 52c, 52d, and 52f of the signal amplifiers 50A and 50B are electrically connected through the bonding wires 20e to 20h to the electrode pads 18a to 18d, respectively.

Cross-sectional structures of the light-receiving elements 13a to 13d, the capacitors 14a to 14d, and the optical waveguides 15a to 15f will be described in detail with reference to FIG. 2A to FIG. 2D. As illustrated in FIG. 2A to FIG. 2D, the light-receiving elements 13a to 13d, the capacitors 14a to 14d, and the optical waveguides 15a to 15f are integrated on a substrate 21. The substrate 21 is a semiconductor substrate made of, for example, semi-insulating InP such as Fe-doped InP.

First, a cross-sectional structure of the optical waveguides 15a to 15f will be described. FIG. 2B illustrates a cross-sectional structure of the optical waveguide 15f perpendicular to the optical waveguide direction. The optical waveguide direction corresponds approximately to the second direction B. FIG. 2C illustrates a cross section of the optical waveguide 15f along the optical waveguide direction. Note that the other optical waveguides 15a to 15e have the same cross-sectional structure as that of the optical waveguide 15f.

Referring to FIG. 2B and FIG. 2C, the optical waveguide 15f includes a buffer layer 22, a core layer 23, and a cladding layer 24, in this order, on the substrate 21. The substrate 21 and the buffer layer 22 are made of, for example, semi-insulating InP. The core layer 23 is made of a material (e.g., InGaAsP) that has a refractive index higher than that of the buffer layer 22 and is lattice-matched to the buffer layer 22. For example, InGaAsP of the core layer 23 has a band-gap wavelength of 1.05 µm. The cladding layer 24 is made of a material (e.g., undoped InP) that has a refractive index lower than that of the core layer 23 and is lattice-matched to the core layer 23. A part of the buffer layer 22, the core layer 23, and the cladding layer 24 form a mesa structure that extends in an optical waveguide direction. This mesa structure allows optical signals to propagate within the core layer 23 in the optical waveguide 15f. The pair of side faces and the top face of the mesa structure are covered with two insulating films 26 and 27. The insulating films 26 and 27 are, for example, dielectric films made of silicon nitride (SiN), silicon oxynitride (SiON), or silicon dioxide ($SiO_2$).

Next, a cross-sectional structure of the light-receiving elements 13a to 13d will be described. FIG. 2A illustrates a cross section of the light-receiving element 13d perpendicular to the optical waveguide direction. FIG. 2C illustrates a cross section of the light-receiving element 13d along the optical waveguide direction. Note that the other light-receiving elements 13a to 13c have the same cross-sectional structure as that of the light-receiving element 13d.

Referring to FIG. 2A and FIG. 2C, the light-receiving element 13d includes an etch stop layer 31, an n-type buffer layer 32, an n-type intermediate layer 33, an optical absorption layer 34, an intermediate layer 35, a p-type cladding layer 36, a p-type intermediate layer 37, and a p-type contact layer 38 stacked in this order on the substrate 21. The etch stop layer 31 is made of, for example, undoped InGaAsP and has a band-gap wavelength of, for example, 1.15 µm. The n-type buffer layer 32 is made of, for example, silicon (Si)-doped InP. The n-type intermediate layer 33 is formed to reduce the hetero-barrier at the hetero-junction of the n-type buffer layer 32 and the optical absorption layer 34. The n-type intermediate layer 33 is made of, for example, Si-doped InGaAsP and has a band-gap wavelength of, for example, 1.4 µm. The optical absorption layer 34 is made of, for example, undoped indium gallium arsenide (InGaAs) lattice matched to InP. The intermediate layer 35 is formed to reduce the hetero-barrier at the hetero-junction of the optical absorption layer 34 and the p-type cladding layer 36. The intermediate layer 35 includes, for example, two semiconductor layers made of an undoped or zinc (Zn)-doped InGaAsP layer. The two semiconductor layers constituting the intermediate layer 35 have band-gap wavelengths of, for example, 1.3 µm and 1.1 µm, respectively. The p-type cladding layer 36 is made of, for example, Zn-doped InP. The p-type intermediate layer 37 is formed to reduce the hetero-barrier at the hetero-junction of the p-type cladding layer 36 and the p-type contact layer 38. The p-type intermediate layer 37 includes, for example, two Zn-doped InGaAsP layers that have band-gap wavelengths of, for example, 1.1 µm and 1.3 µm, respectively. The p-type contact layer 38 is made of, for example, Zn-doped InGaAs.

As illustrated in FIG. 2A, a part of the n-type buffer layer 32, the n-type intermediate layer 33, the optical absorption layer 34, the intermediate layer 35, the p-type cladding layer 36, the p-type intermediate layer 37, and the p-type contact layer 38 form a mesa structure that extends in an optical waveguide direction (i.e., in the second direction B in the present embodiment). The mesa structure has a pair of side faces. The n-type intermediate layer 33, the optical absorption layer 34, and the intermediate layer 35 are in contact with the core layer 23 of the optical waveguide 15f at one end in the optical waveguide direction, and are optically coupled to the core layer 23. The pair of side faces of the mesa structure are embedded by buried layer 41, respectively. The buried layer 41 is made of semi-insulating semiconductor, such as iron (Fe)-doped InP.

The light-receiving element 13d further includes the two insulating films 26 and 27. The insulating films 26 and 27 are common to those of the optical waveguides 15a to 15f. The insulating films 26 and 27 extend from the top face of the mesa structure over the buried layer. The insulating films 26 and 27 have an opening in the top face of the mesa structure. An ohmic electrode 39 is disposed on the p-type contact layer 38 exposed from the insulating films 26 and 27 through the opening. The ohmic electrode 39 is made of, for example, gold-zinc (AuZn) or platinum (Pt). An interconnection pattern 42 is disposed on the ohmic electrode 39. As illustrated in FIG. 2C, the interconnection pattern 42 extends in the optical waveguide direction (i.e., in the second direction B) to electrically connect the ohmic electrode 39 to the electrode pad 16d. For example, the interconnection pattern 42 has a laminated structure with titanium-tungsten (TiW)/gold (Au) layers or titanium (Ti)/Pt/Au layers. The electrode pad 16d is formed by, for example, Au plating.

As illustrated in FIG. 2A, the insulating film 26 has another opening on the n-type buffer layer 32, the opening being away from the mesa structure of the light-receiving element 13d. An ohmic electrode 43 is disposed on the n-type buffer layer 32 exposed from the insulating film 26 through the opening. The ohmic electrode 43 is made of, for example, gold-germanium (AuGe) or gold-germanium-nickel (AuGeNi). A bias line 48 is disposed on the ohmic electrode 43. The bias line 48 extends to a lower metal layer of the capacitor 14d as described later.

Next, a cross-sectional structure of the capacitors 14a to 14d will be described. FIG. 2B illustrates a cross section of the capacitor 14d perpendicular to the optical waveguide direction. FIG. 2D illustrates a cross section of the capacitor 14d along the optical waveguide direction. Note that the other capacitors 14a to 14c have the same cross-sectional structure as that of the capacitor 14d.

Referring to FIG. 2B and FIG. 2D, the capacitor 14d includes a semiconductor layer 28, a base layer 49, the insulating film 26, a lower metal layer (first metal layer) 44, the insulating film 27, and an upper metal layer (second metal layer) 45 stacked in this order on the substrate 21. The semiconductor layer 28 and the base layer 49 each are semiconductor layers grown to form the buffer layer 22 of the optical waveguides 15a to 15f and the core layer 23, respectively. That is, the semiconductor layer 28 is made of the same material as the buffer layer 22 such as semi-insulating InP. The base layer 49 is made of the same material as the core layer 23 such as InGaAsP.

The lower metal layer 44 is formed on the base layer 49. The upper metal layer 45 is formed on the lower metal layer 44. The insulating film 26 is interposed between the base layer 49 and the lower metal layer 44. The insulating film 27 is interposed between the lower metal layer 44 and the upper metal layer 45. For example, the lower metal layer 44 and the upper metal layer 45 have a metal laminated structure with TiW/Au layers or Ti/Pt/Au layers. The insulating films 26 and 27 are common to those of the light-receiving elements 13a to 13d and the optical waveguides 15a to 15f. The insulating films 26 and 27 are, for example, dielectric films made of SiN, SiON, or SiO$_2$. Thus, the capacitor 14d has a so-called metal-insulator-metal (MIM) structure in which the insulating film 27 is interposed between the lower metal layer 44 and the upper metal layer 45. The MIM structure is embedded by buried layer 41.

The insulating film 27 has an opening on a part of the lower metal layer 44 not covered by the upper metal layer 45. An interconnection pattern 46 is disposed on the lower metal layer 44 exposed from this opening. In the optical waveguide direction (i.e., in the second direction B), the interconnection pattern 46 extends in a direction away from the edge 10b of the optical waveguide receiver 10 so as to electrically connect the lower metal layer 44 to the electrode pad 17d. An interconnection pattern 47 is disposed on the upper metal layer 45. In the optical waveguide direction (i.e., in the second direction B), the interconnection pattern 47 extends in a direction toward the edge 10b of the optical waveguide receiver 10 so as to electrically connect the upper metal layer 45 to the electrode pad 18d. For example, the interconnection patterns 46 and 47 have a laminated structure with TiW/Au layers or Ti/Pt/Au layers. The electrode pad 17d and the electrode pad 18d are formed, for example, by Au plating.

Figure 8A:
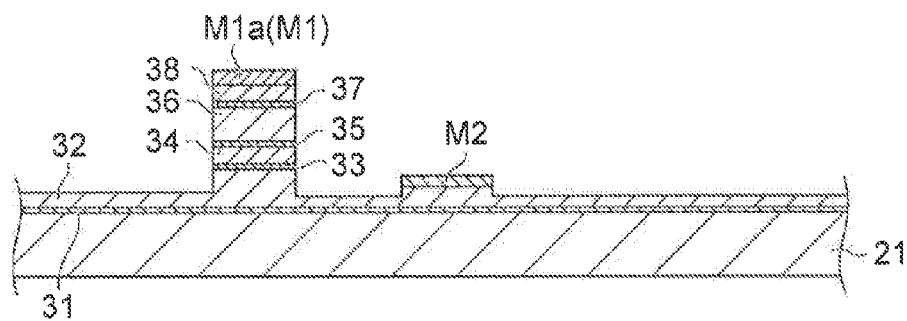
FIGS. 8A, 8B, 8C, and 8D are cross-sectional views taken along the lines V-V, VI-VI, VII-VII, and VIII-VIII, respectively, of FIG. 7.
Figure 8B:
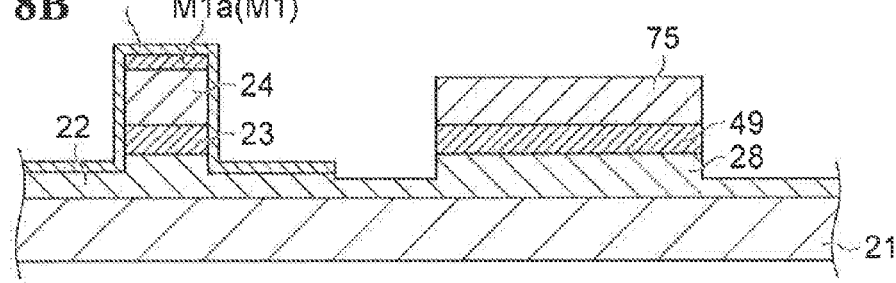
Figure 8C:
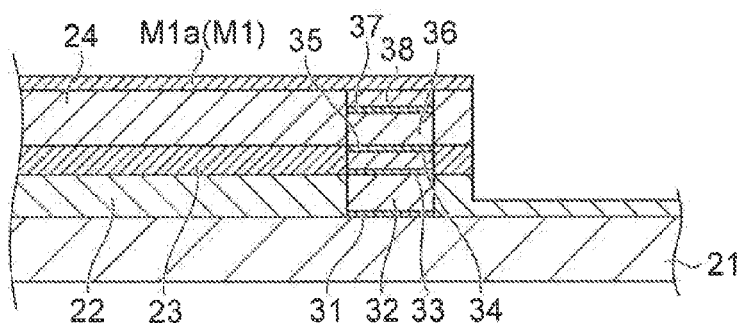
Figure 8D:
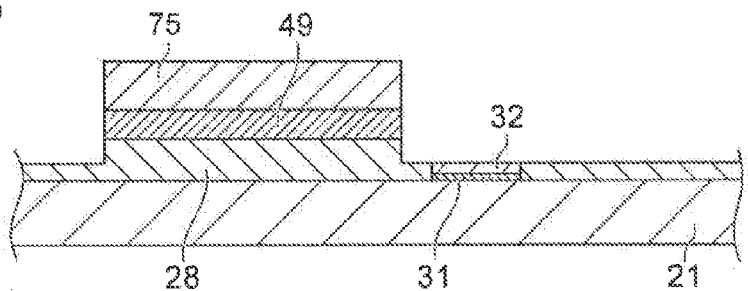
Figure 9:
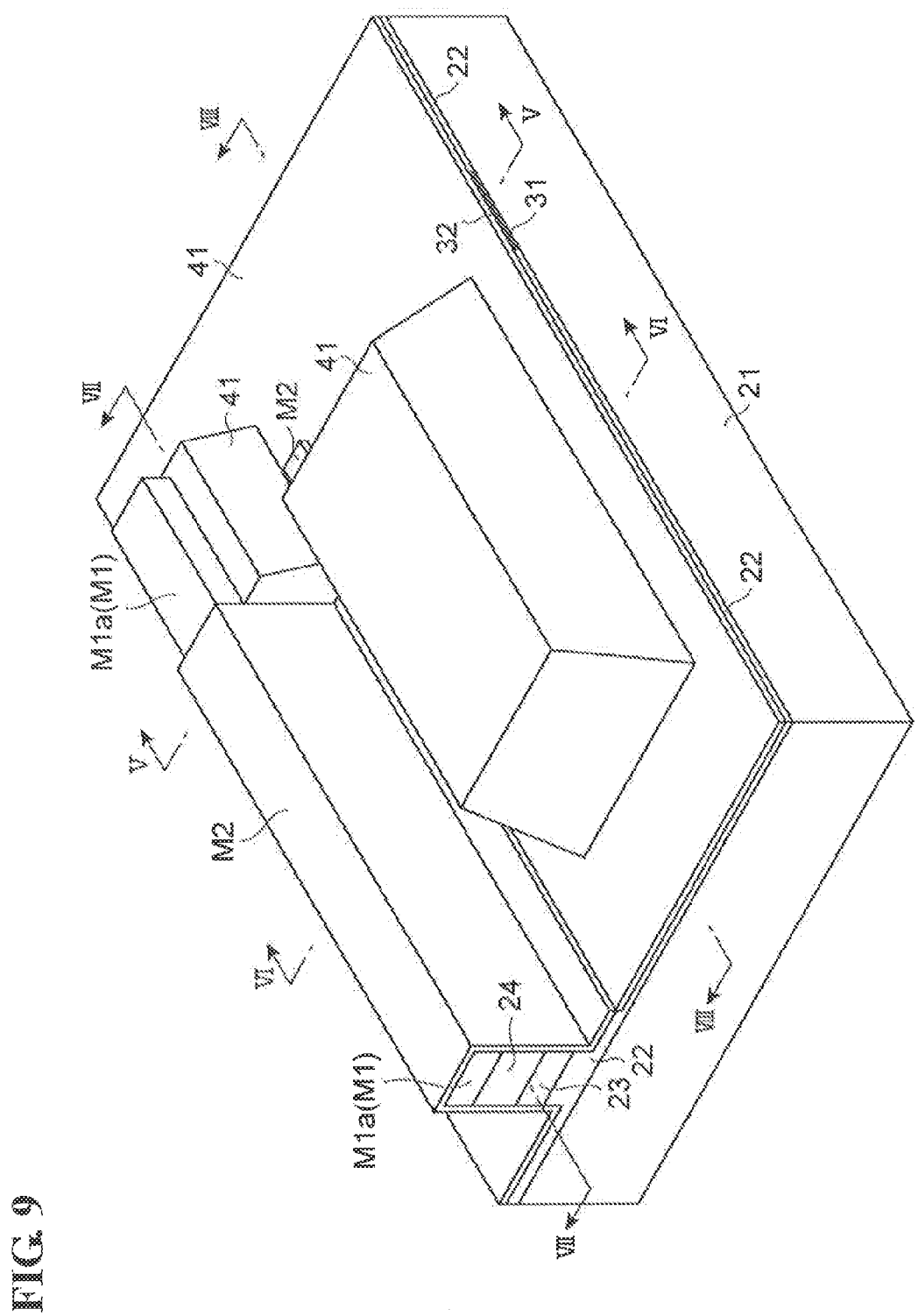
FIG. 9 is a perspective view illustrating a step (burying step) of manufacturing the optical waveguide receiver.
Figure 10A:
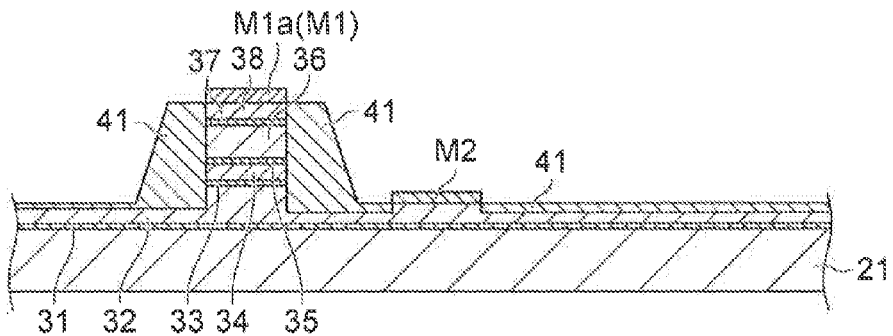
FIGS. 10A, 10B, 10C, and 10D are cross-sectional views taken along the lines V-V, VI-VI, VII-VIII, and VIII-VIII, respectively, of FIG. 9.
Figure 10B:
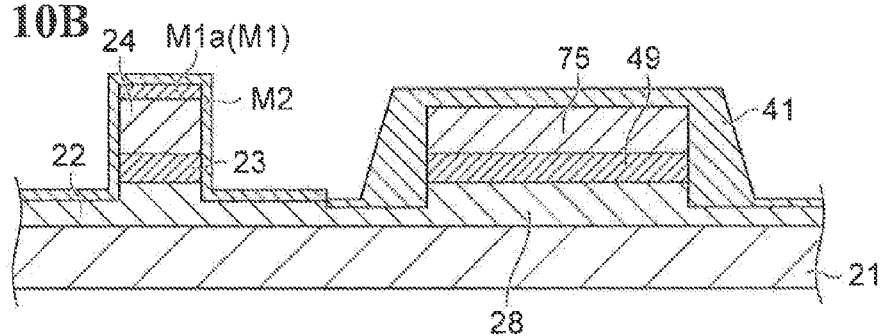
Figure 10C:
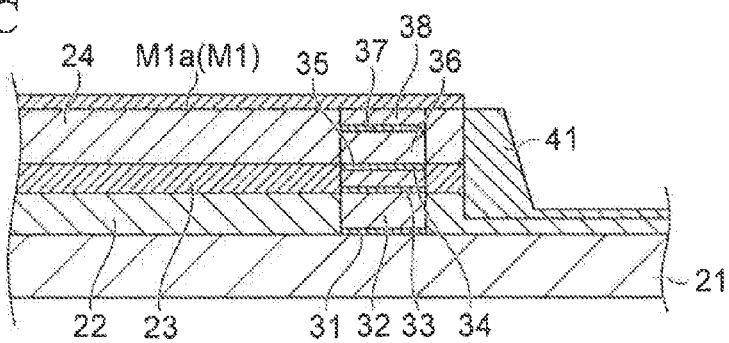
Figure 10D:
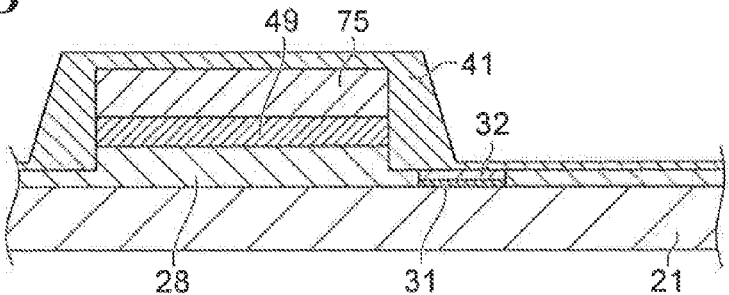
Figure 11:
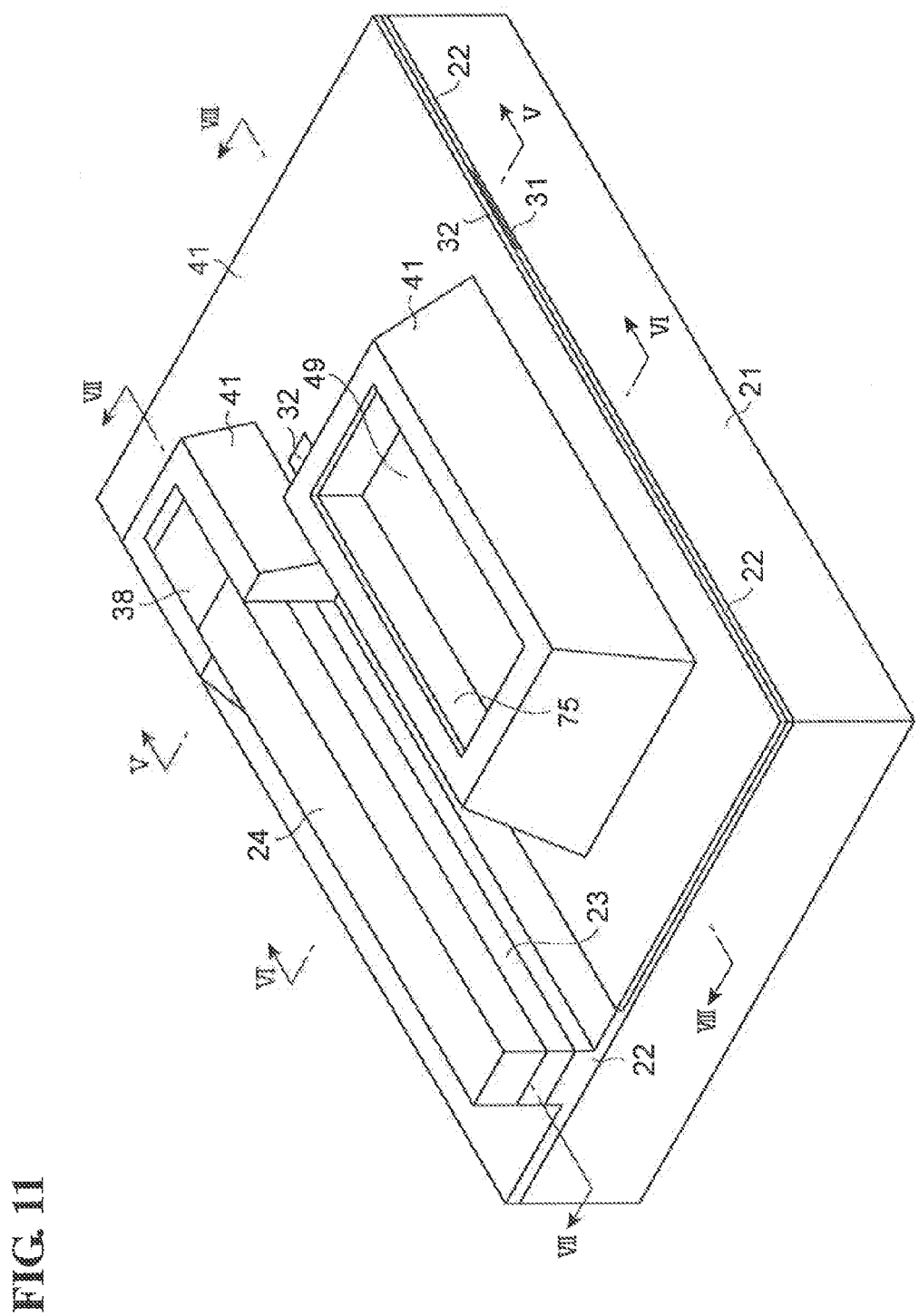
FIG. 11 is a perspective view illustrating a step (second etching step) of manufacturing the optical waveguide receiver.
Figure 12A:
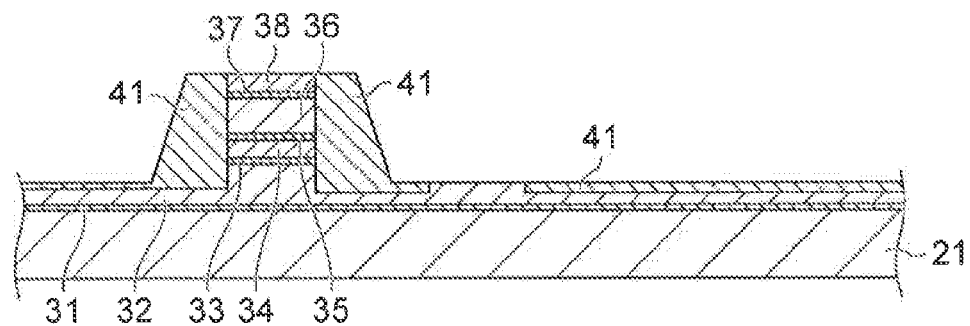
FIGS. 12A, 12B, 12C, and 12D are cross-sectional views taken along the lines V-V, VII-VII, and VIII-VIII, respectively, of FIG. 11.
Figure 12B:
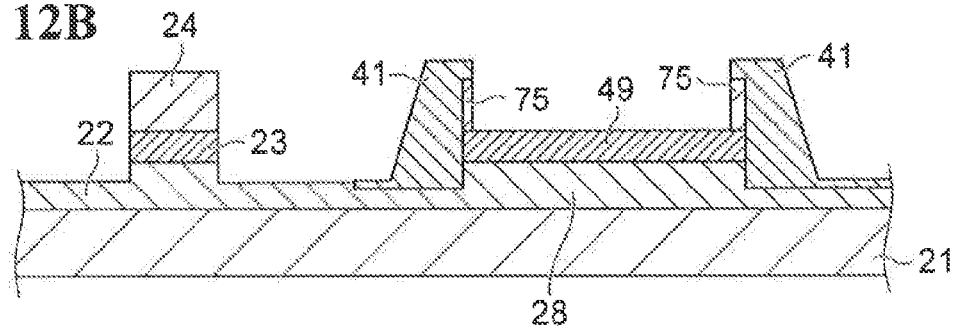
Figure 12C:
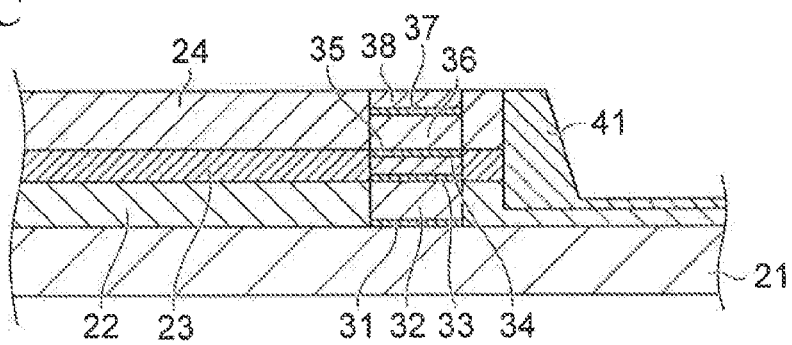
Figure 12D:
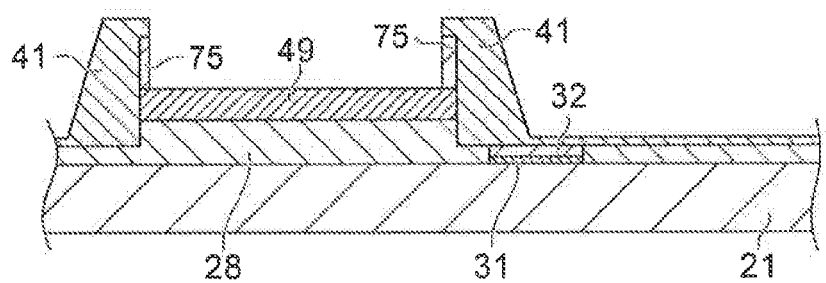
Figure 13A:
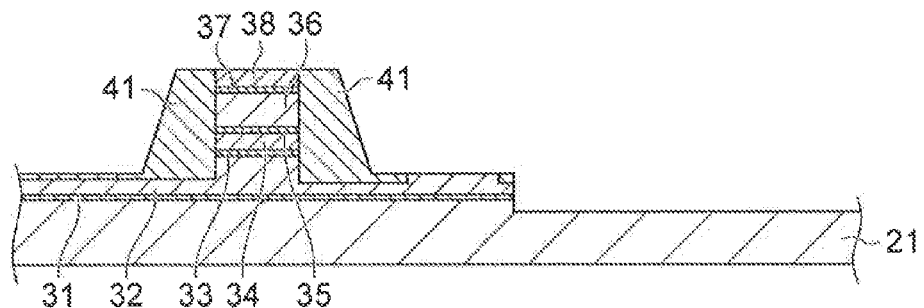
FIGS. 13A to 13D are cross-sectional views illustrating a step (electrical isolation step) of manufacturing the optical waveguide receiver.
Figure 13B:
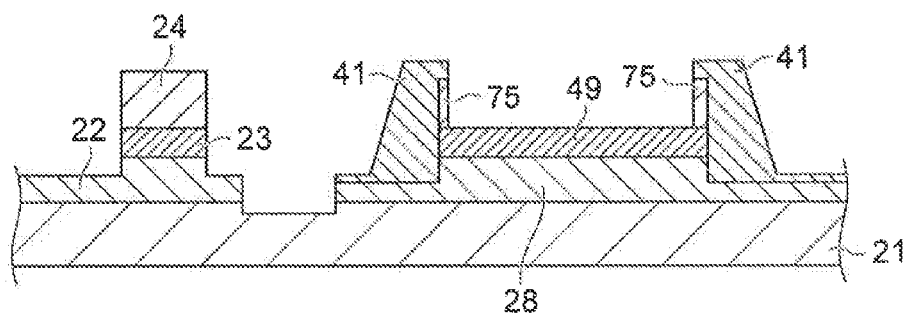
Figure 13C:
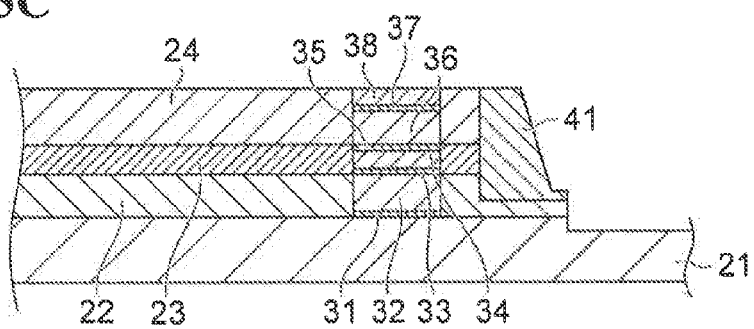
Figure 13D:
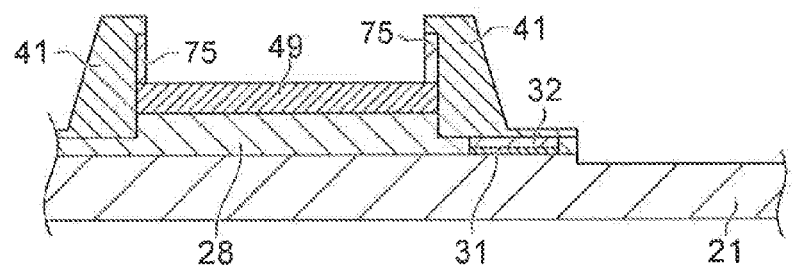
Figure 14A:
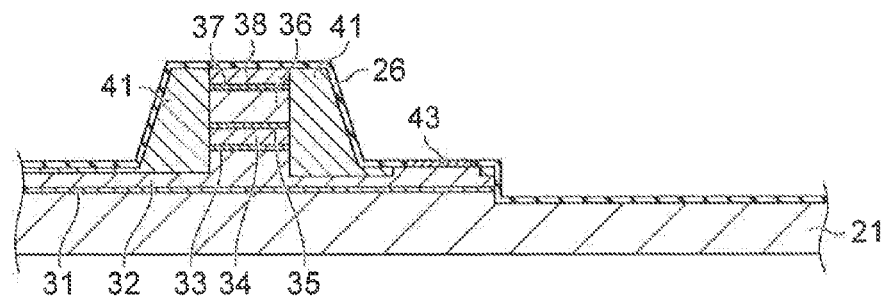
FIGS. 14A to 14D are cross-sectional views illustrating a step (insulating film-forming step) of manufacturing the optical waveguide receiver.
Figure 14B:
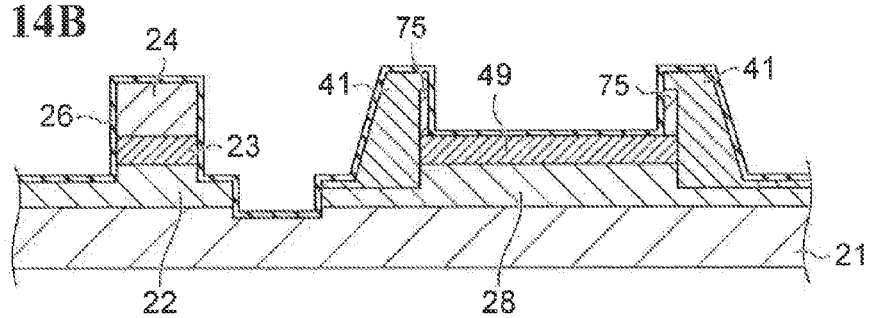
Figure 14C:
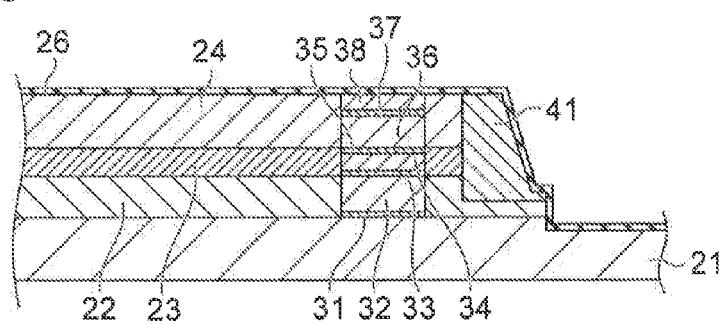
Figure 14D:
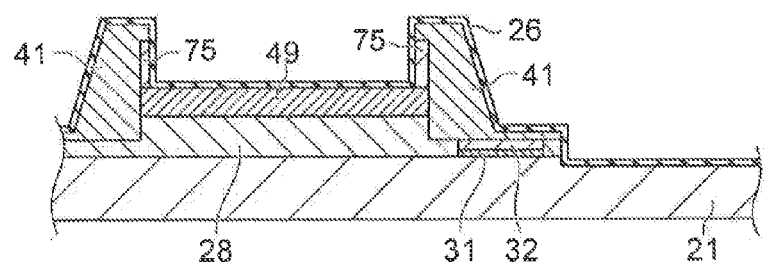
Figure 15A:
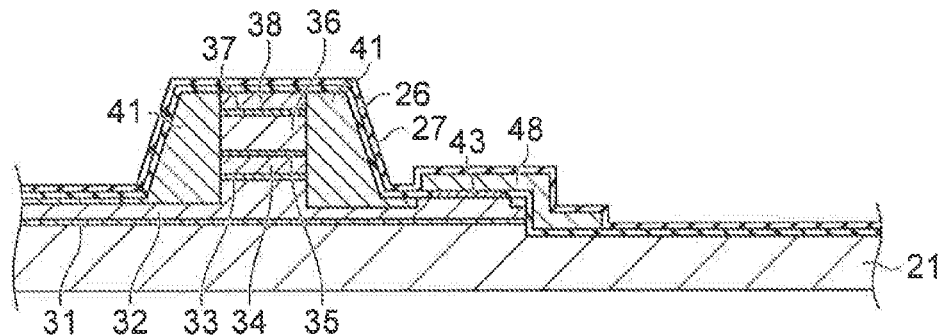
FIGS. 15A to 15D are cross-sectional views illustrating a step (first metal layer and insulating film-forming step) of manufacturing the optical waveguide receiver.
Figure 15B:
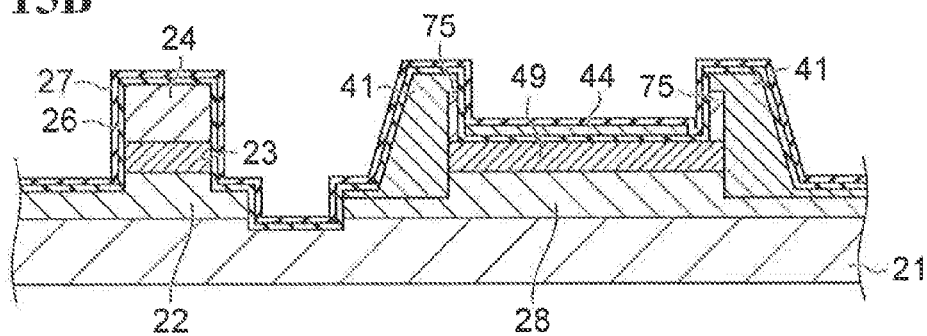
Figure 15C:
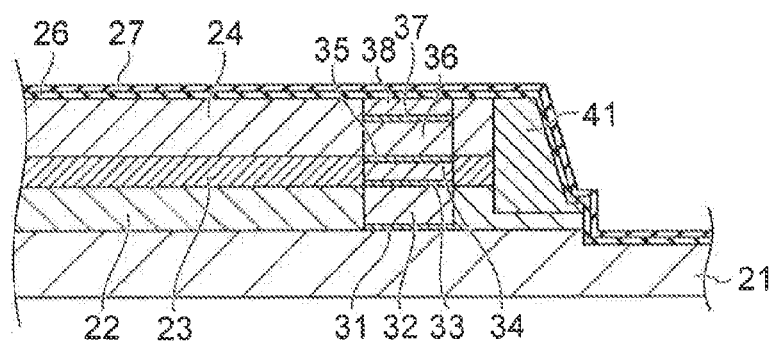
Figure 15D:
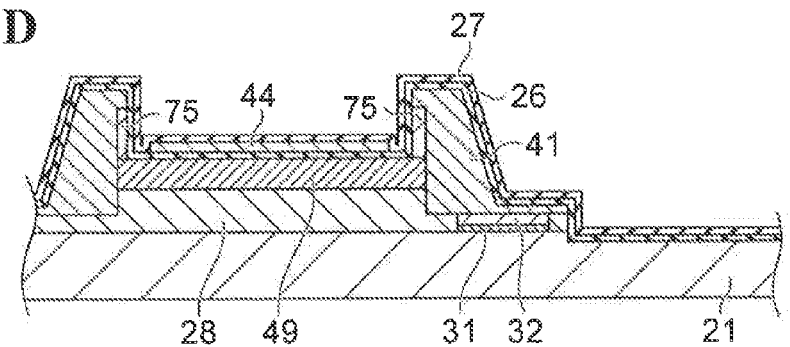
Figure 16A:
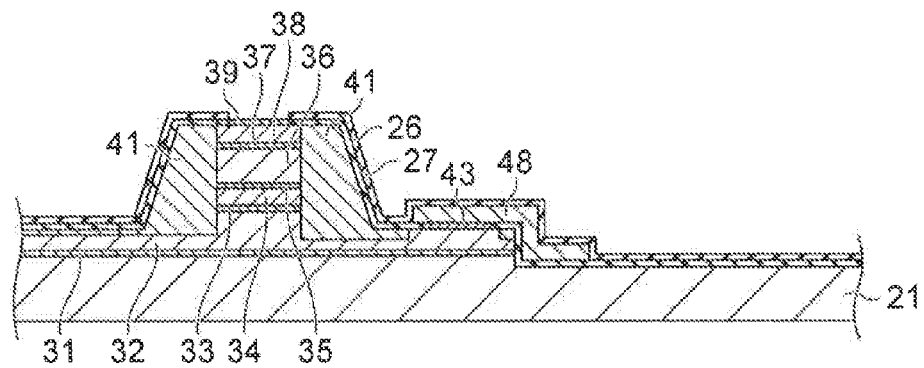
FIGS. 16A to 16D are cross-sectional views illustrating a step (second metal layer-forming step) of manufacturing the optical waveguide receiver.
Figure 16B:
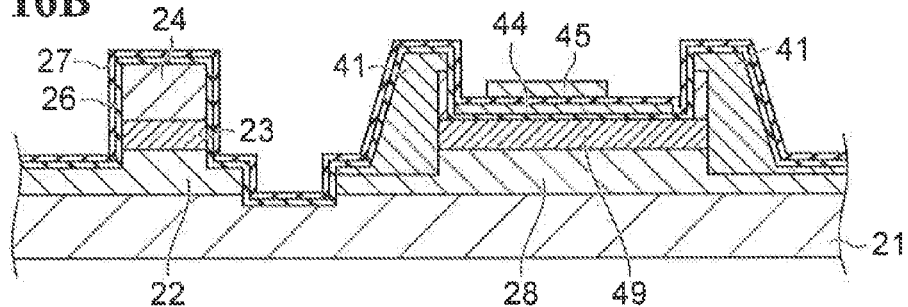
Figure 16C:
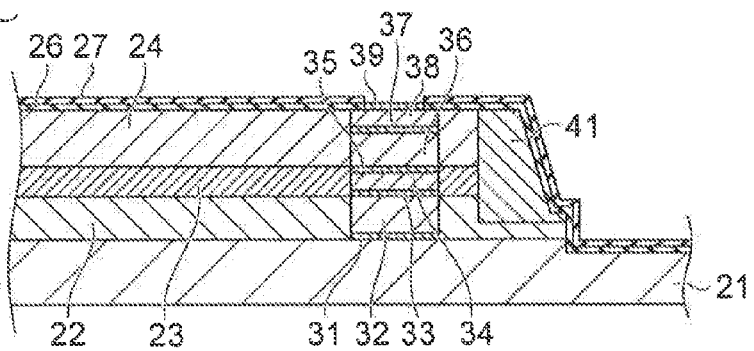
Figure 16D:
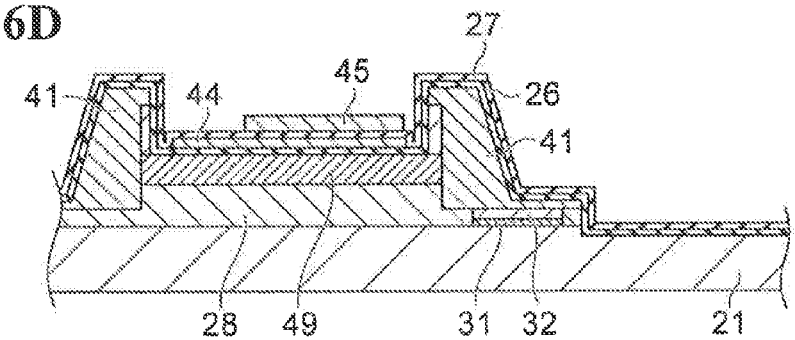
Figure 17A:
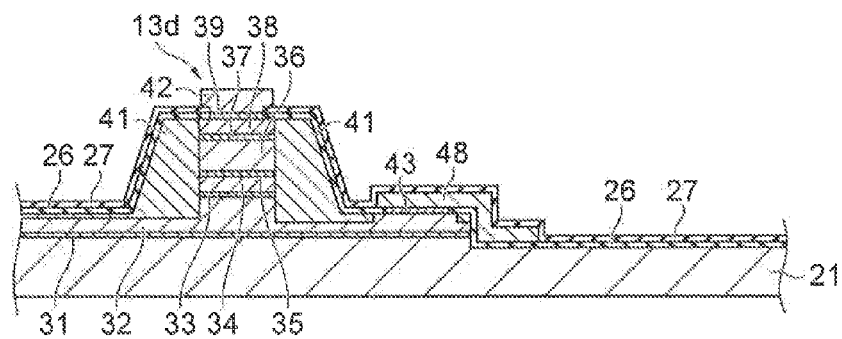
FIGS. 17A to 17D are cross-sectional views illustrating a step (wiring line-forming step) of manufacturing the optical waveguide receiver.
Figure 17B:
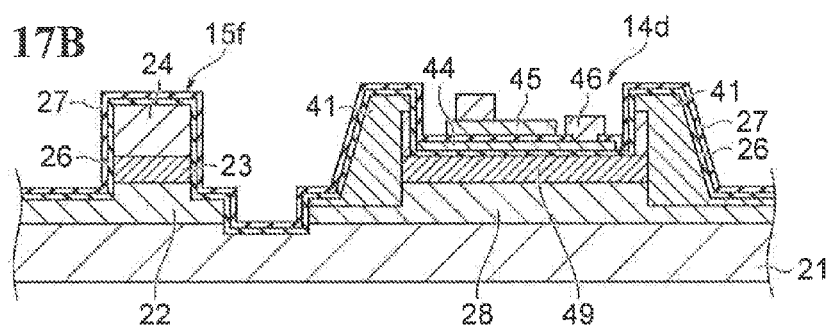
Figure 17C:
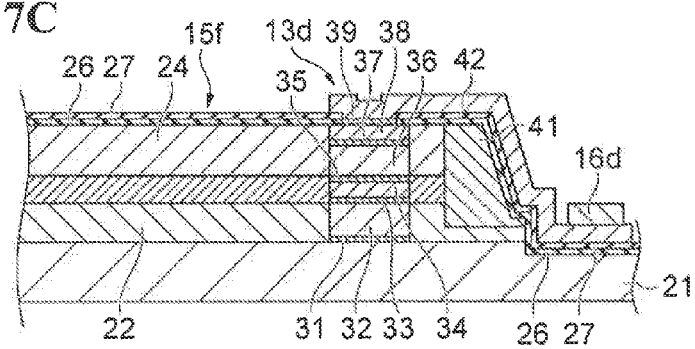
Figure 17D:
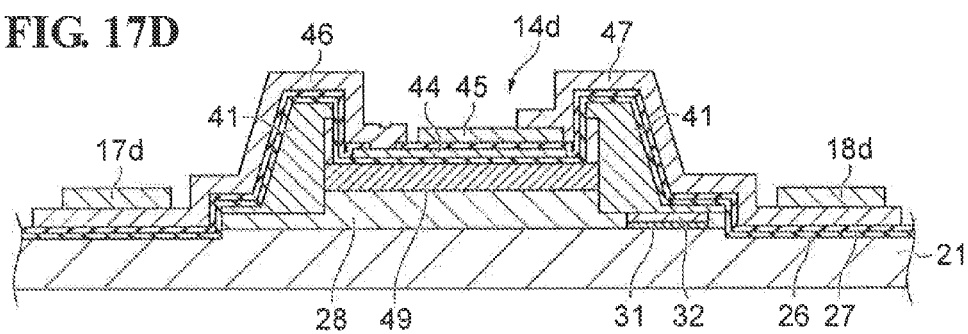

A method for manufacturing the optical waveguide receiver 10, which has the above configuration, will now be described. FIGS. 3 to 17D are illustrations showing steps of the method for manufacturing the optical waveguide receiver 10 and show a region containing the light-receiving element 13d, the capacitor 14d, and the optical waveguide 15f. FIGS. 3 to 7, 9, and 11 are perspective views of the optical waveguide receiver 10 in process. FIGS. 8A to 8D, 10A to 10D, and 12A to 12D are cross-sectional views of the optical waveguide receiver 10 shown in FIGS. 7, 9, and 11, respectively. Each of FIGS. 8A, 10A, and 12A is a cross-sectional view taken along the line V-V of a corresponding one of FIGS. 7, 9, and 11. Each of FIGS. 8B, 10B, and 12B is a cross-sectional view taken along the line VI-VI of a corresponding one of FIGS. 7, 9, and 11. Each of FIGS. 8C, 10C, and 12C is a cross-sectional view taken along the line VII-VIII of a corresponding one of FIGS. 7, 9, and 11. Each of FIGS. 8D, 10D, and 12D is a cross-sectional view taken along the line VIII-VIII of a corresponding one of FIGS. 7, 9, and 11. Likewise, each of FIGS. 13A to 13D, 14A to 14D, 15A to 15D, 16A to 16D, and 17A to 17D is a cross-sectional view taken along a corresponding one of the lines V-V, VI-VI, VII-VII, and VIII-VIII of FIGS. 7, 9, and 11.

Figure 3:
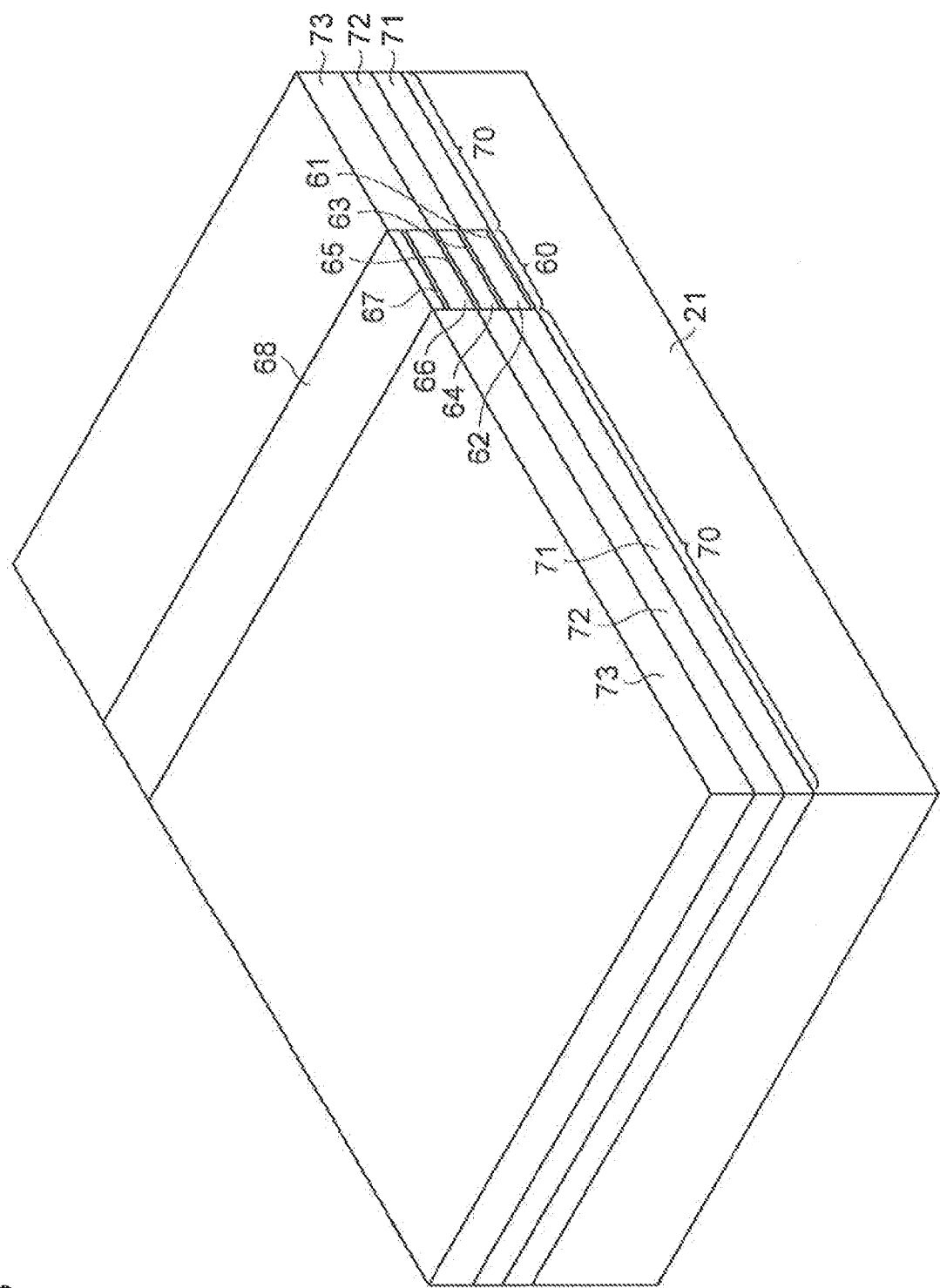
FIG. 3 is a perspective view illustrating a step (first growth step) of manufacturing the optical waveguide receiver.

As illustrated in FIG. 3, a first stacked semiconductor layer section 60 for forming the light-receiving elements 13a to 13d and second stacked semiconductor layer sections 70 for forming the optical waveguides 15a to 15f are grown on the substrate 21 by an epitaxial growth method (a first growth step). In particular, for forming the etch stop layer 31, the n-type buffer layer 32, and the n-type intermediate layer 33, semiconductor layers 61 to 63 are grown. The semiconductor layers 61 to 63 are made of a III-V group compound semiconductor. For example, a metal-organic vapor phase epitaxy (MOVPE) method is used to grow these layers. Next, a mask having a pattern including regions for forming the light-receiving elements 13a to 13d is formed on the semiconductor layer 63. The mask formed on the semiconductor layer 63 is made of, for example, SiO$_2$. The semiconductor layers 61 to 63 are etched using the mask. Next, in such a state that the mask remains, semiconductor layer 71 for forming the buffer layer 22 is selectively grown on a region of the substrate 21 that is not covered with the mask. The semiconductor layer 71 is made of, for example, a III-V group compound semiconductor such as semi-insulating InP. After the mask is removed, semiconductor layers 64 to 68 for forming the optical absorption layer 34, the intermediate layer 35, the p-type cladding layer 36, the p-type intermediate layer 37, and the p-type contact layer 38 are grown over the substrate 21. Another mask having the same pattern as that of the mask used for etching the semiconductor layers 61 to 63 and selectively growing the semiconductor layer 71 is formed on the semiconductor layer 68. The mask formed on the semiconductor layer 68 is made of, for example, SiO$_2$. The semiconductor layers 64 to 68 are etched using this mask formed on the semiconductor layer 68. Thereafter, in such a state that the mask remains, semiconductor layers 72 and 73 are selectively grown on a region of the substrate 21 that is not covered with this mask. The semiconductor layers 72 and 73 are made of a III-V group compound semiconductor, and are grown for forming the core layer 23 and the cladding layer 24, respectively. The semiconductor layer 72 is made of, for example, InGaAsP. The semiconductor layer 73 is made of, for example, undoped InP. In this step, the first stacked semiconductor layer section 60, which includes the semiconductor layers 61 to 68 for forming the light-receiving elements 13a to 13d, and the second stacked semiconductor layer sections 70, which include the semiconductor layers 71 to 73 for forming the optical waveguides 15a to 15f, are formed. Then, the mask formed on the semiconductor layer 68 is removed.

Figure 4:
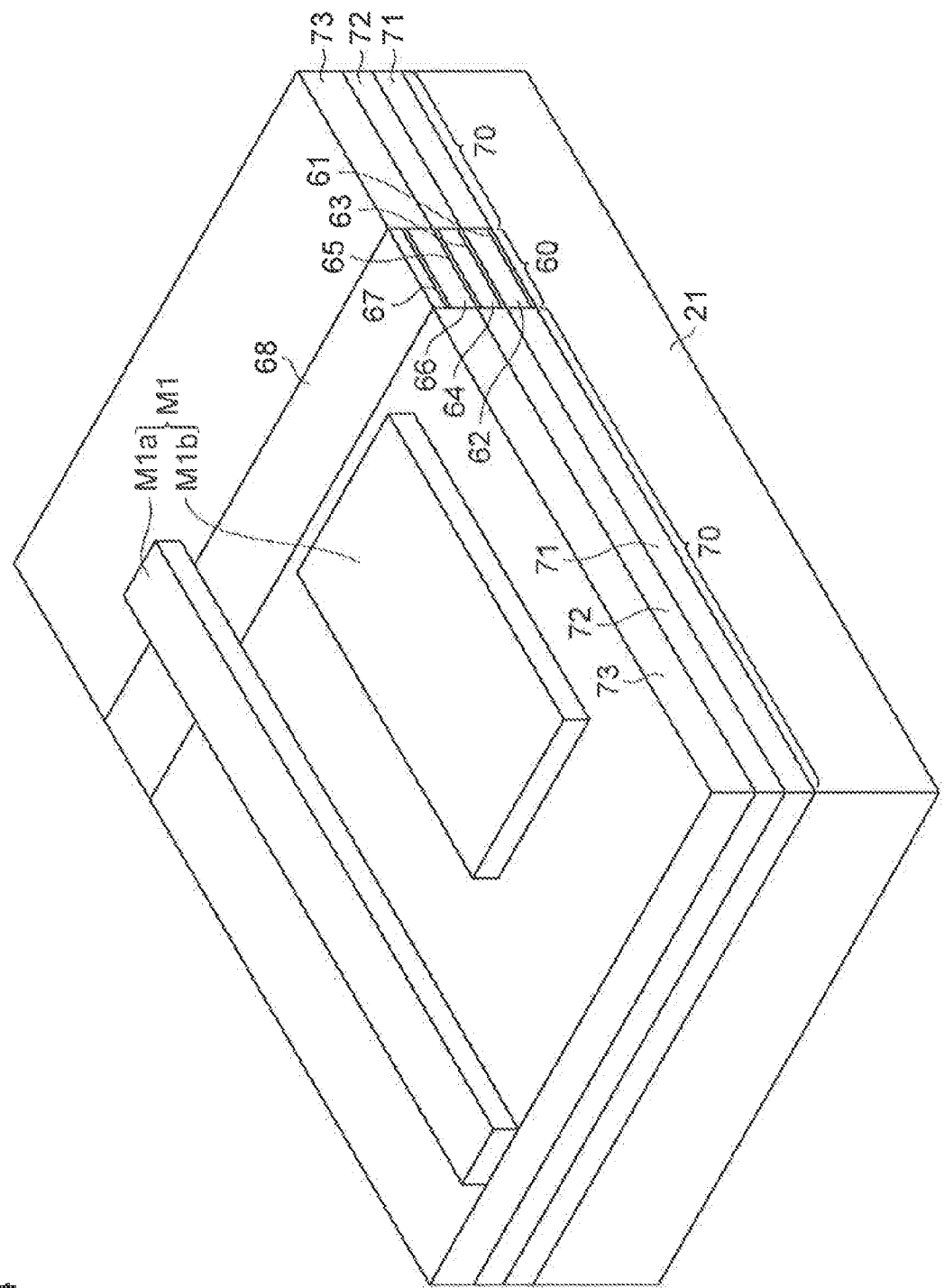
FIG. 4 is a perspective view illustrating a step (mask-forming step) of manufacturing the optical waveguide receiver.
Figure 5:
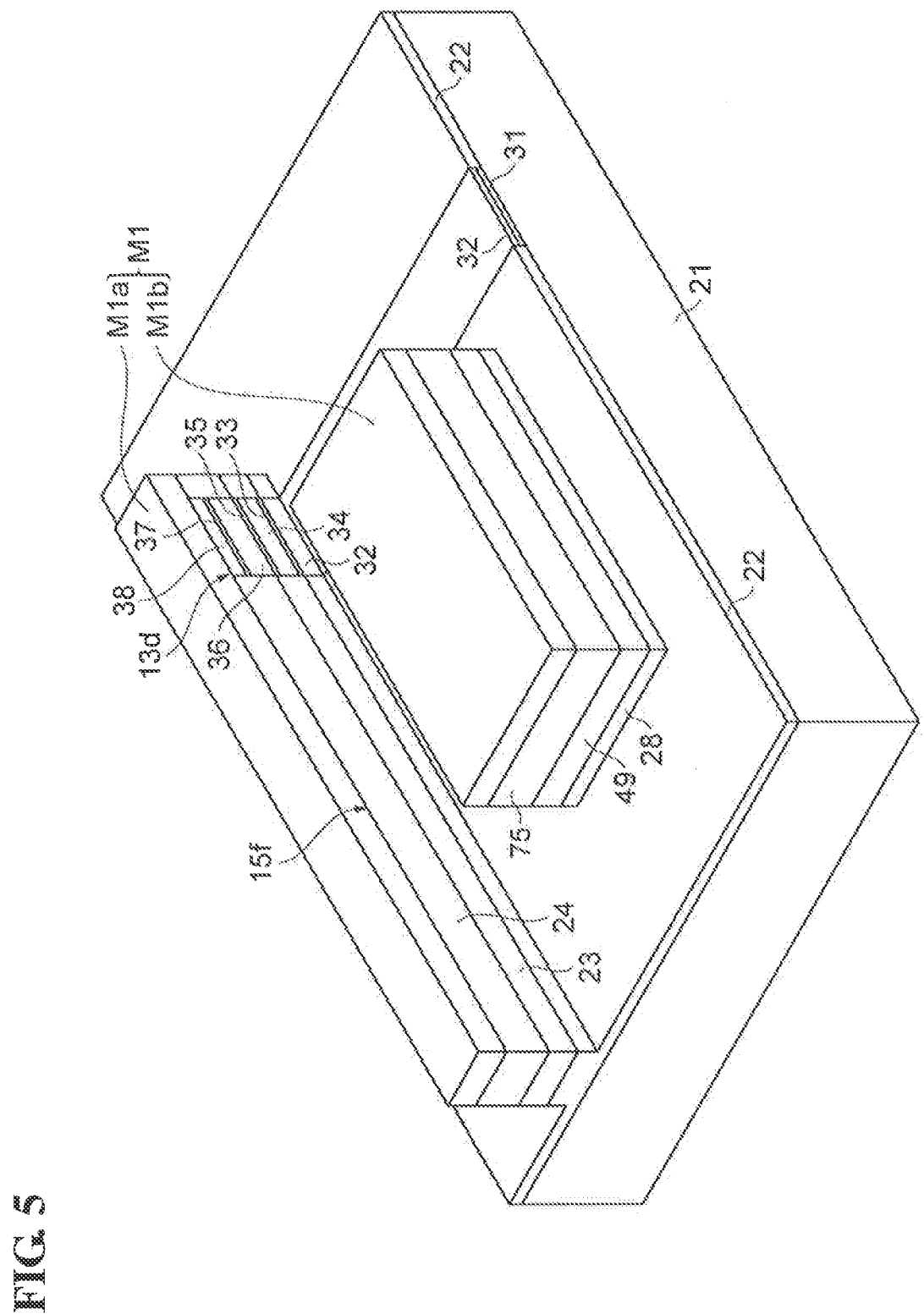
FIG. 5 is a perspective view illustrating a step (first etching step) of manufacturing the optical waveguide receiver.

Subsequently, as illustrated in FIG. 4, an etching mask M1 is formed over the first stacked semiconductor layer section 60 and the second stacked semiconductor layer sections 70. The etching mask M1 is made from a dielectric film made of SiN, SiON, $SiO_2$, or the like and includes first portions M1a and second portions M1b. The first portions M1a cover portions of the first stacked semiconductor layer section 60 that are used to form the light-receiving elements 13a to 13d and portions of the second stacked semiconductor layer sections 70 that are used to form the optical waveguides 15a to 15f. The first portions M1a have substantially the same shape in plan view as that of the light-receiving elements 13a to 13d and the optical waveguides 15a to 15f. The first portions M1a have a width, for example, 2 µm in a direction perpendicular to the optical waveguide direction. The second portions M1b cover portions of the second stacked semiconductor layer sections 70 that are used to form the capacitors 14a to 14d. The second portions M1b have substantially the same shape in plan view as that of the capacitors 14a to 14d. As illustrated in FIG. 5, the first and second stacked semiconductor layer sections 60 and 70 are dry-etched using the etching mask M1 (a first etching step). The etching is preferably stopped halfway through the semiconductor layer 62 and the semiconductor layer 71.

By the etching, the mesa structures of the light-receiving elements 13a to 13d are formed and the etch stop layer 31, the n-type buffer layer 32, the n-type intermediate layer 33, the optical absorption layer 34, the intermediate layer 35, the p-type cladding layer 36, the p-type intermediate layer 37, and the p-type contact layer 38 are also formed in each of the mesa structures of the light-receiving elements 13a to 13d. By the etching, the mesa structures of the optical waveguides 15a to 15f are formed and the buffer layer 22, the core layer 23, and the cladding layer 24 are also formed in each of the mesa structures of the optical waveguides 15a to 15f. The buffer layer 22 is a lower cladding layer in the present embodiment. Furthermore, the following structures are formed by the etching: terrace-shaped structures each including the semiconductor layer 28, base layer 49, and semiconductor layer 75 of a corresponding one of the capacitors 14a to 14d. That is, each of the semiconductor layer 28, the base layer 49, and the semiconductor layer 75 is a portion of a corresponding one of the semiconductor layers 71 to 73 of the second stacked semiconductor layer section 70, the semiconductor layers 71 to 73 being formed for the buffer layer 22, core layer 23, and cladding layer 24 of each of the optical waveguides 15a to 15f, respectively.

Figure 6:
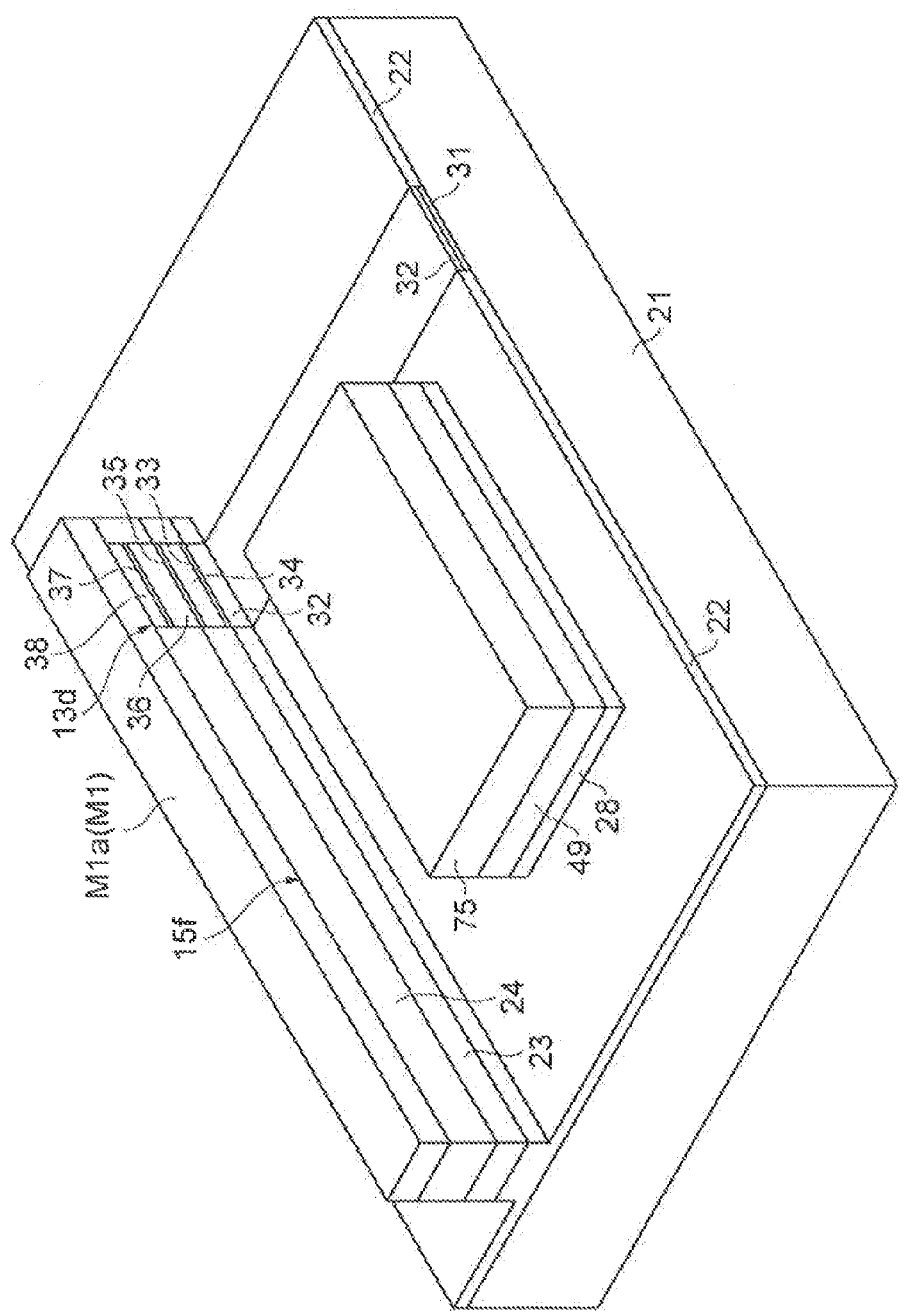
FIG. 6 is a perspective view illustrating a step of manufacturing the optical waveguide receiver.
Figure 7:
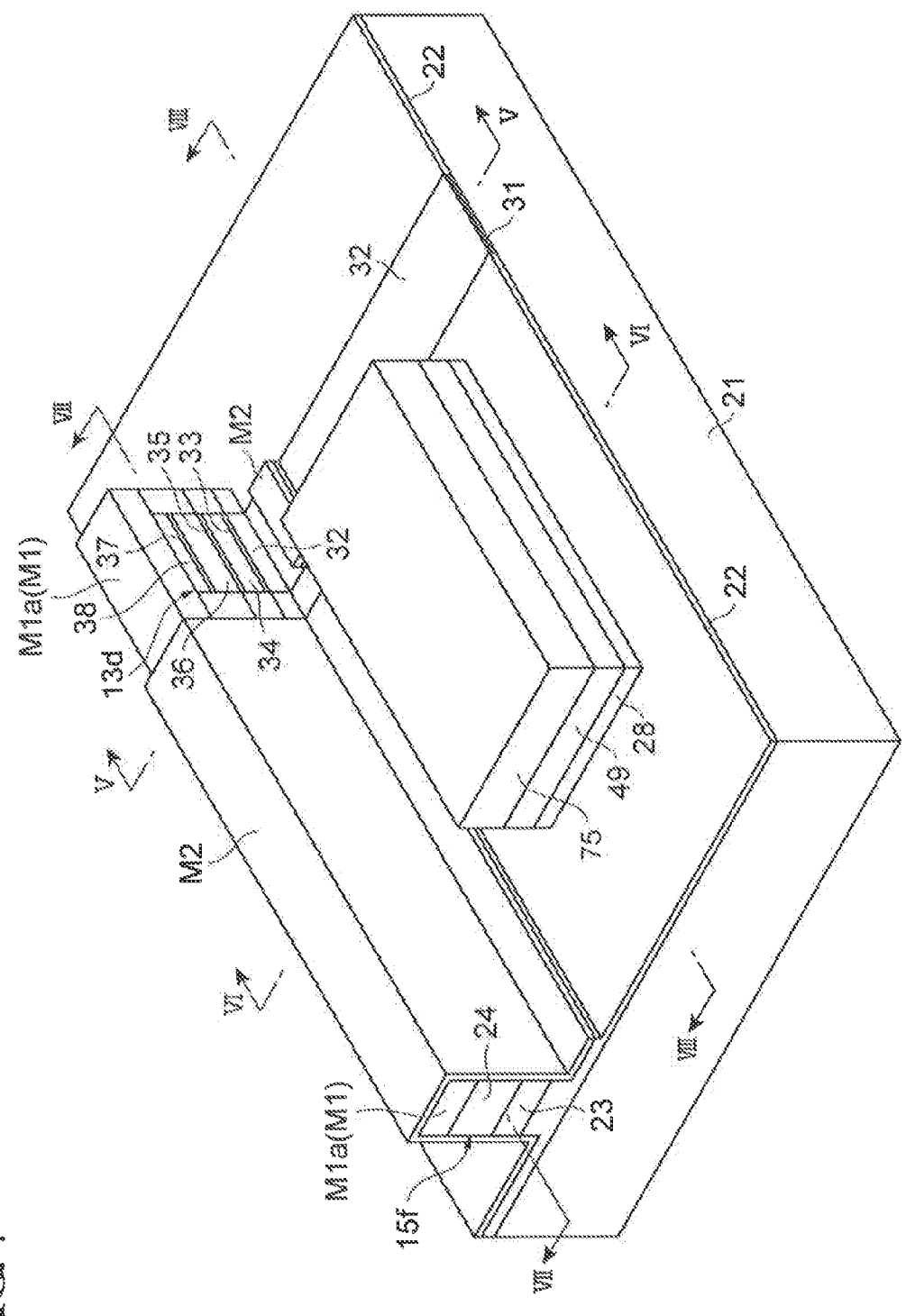
FIG. 7 is a perspective view illustrating a step (buried grown mask-forming step) of manufacturing the optical waveguide receiver.

Subsequently, as illustrated in FIG. 6, the second portions M1b are removed from the etching mask M1 with the first portions M1a left. As illustrated in FIGS. 7 and 8A to 8D, a mask M2 is formed so as to cover the optical waveguides 15a to 15f. The mask M2 is made from a dielectric film made of SiN, SiON, $SiO_2$, or the like. The mask M2 is formed on both side faces and the top face of the mesa structure of each of the optical waveguides 15a to 15f. Furthermore, the mask M2 is also formed on a region of an exposed surface of each n-type buffer layer 32. This results in that the light-receiving elements 13a to 13d and portions of the mesa structures of the optical waveguides 15a to 15f adjacent to the light-receiving elements 13a to 13d are exposed from the mask M2. Furthermore, the semiconductor layer 28, the base layer 49, the semiconductor layer 75, and regions adjacent thereto are exposed from the mask M2. In order to remove a damaged layer formed in the dry etching process at the first etching step, a surface of portion exposed from the mask M2 is wet-etched.

Subsequently, as illustrated in FIGS. 9 and 10A to 10D, the buried layer 41 is grown on portions exposed from the etching mask M1 and the portions exposed from the mask M2 by an MOVPE method. The buried layer 41 is made of, for example, a semi-insulating semiconductor such as Fe-doped InP. In this step, the buried layer 41 is grown so as to embed side faces of the mesa structures of the light-receiving elements 13a to 13d. A slight amount of a dichloroethylene gas is preferably supplied with source gases to grow the buried layer 41. For example, a flow rate of the dichloroethylene gas is about 6 ccm. By supplying the dichloroethylene gas, the growth rate of the buried layer 41 in a direction perpendicular to a principal surface of the substrate 21 is suppressed and the growth rate of the buried layer 41 in a direction parallel to the principal surface of the substrate 21 is kept large. As a result, the abnormal growth of the buried layer 41 on side faces of the mesa structures is suppressed. The buried layer 41 can be formed so as to have relatively flat surfaces. Therefore, electrode lines can be formed well on the buried layer 41. Furthermore, the buried layer 41 is grown so as to embed side faces of the semiconductor layer 28, the base layer 49, and the semiconductor layer 75 and the top face of the semiconductor layer 75.

Subsequently, as illustrated in FIGS. 11 and 12A to 12D, after the etching mask M1 and the mask M2 are removed, the semiconductor layer 75 (that is, in the second stacked semiconductor layer section 70, a portion of the semiconductor layer 73 that is covered by the second portion M1b of the etching mask M1) and the buried layer 41 are etched. A Surface of the base layer 49 is exposed by the etching (a second etching step). The base layer 49 is a portion of the semiconductor layer 72 of the second stacked semiconductor layer section 70, the semiconductor layer 72 being formed for the core layer 23 of each of the optical waveguides 15a to 15f, and are formed above the substrate 21 by epitaxial growth. Therefore, the surface roughness of the semiconductor layer 72 is 0.05 µm or less. In the second etching step, the etching is performed using a mask (not shown) having an opening located only on the semiconductor layer 75. The etching is performed under conditions where the etching rates of the buried layer 41 and the semiconductor layer 75 are sufficiently higher than the etching rate of the base layer 49. In particular, the etching is wet etching using an etching solution containing hydrochloric acid. In the present embodiment, the buried layer 41 and the semiconductor layer 75 are made of an InP semiconductor and the base layer 49 is made of an InGaAsP semiconductor. The etching rate of InP semiconductor is sufficiently higher than the etching rate of the InGaAsP semiconductor in wet etching using an etching solution containing hydrochloric acid. Thus, the base layer 49 functions as an etch stop layer and therefore the buried layer 41 and the semiconductor layer 75 can be selectively etched. An exposed surface of each base layer 49 has a width of, for example, 100 µm in the first direction A (refer to FIG. 1) and a width of, for example, 300 µm in the second direction B (refer to FIG. 1).

Subsequently, as illustrated in FIGS. 13A to 13D, in order to electrically isolate the light-receiving elements 13a to 13d, the optical waveguides 15a to 15f, and the capacitors 14a to 14d from each other, the substrate 21 is exposed by etching the buffer layer 22 and the buried layer 41 around the light-receiving elements 13a to 13d, the optical waveguides 15a to 15f, and the capacitors 14a to 14d. The following regions are ensured by the etching: regions for forming the electrode pads 16a to 16d, the electrode pads 17a to 17d, and the electrode pads 18a to 18d as described below. As illustrated in FIGS. 14A to 14D, after the insulating film 26 is formed over the substrate 21, an opening is formed in the insulating film 26 so as to be located on the n-type buffer layer 32 exposed from the buried layer 41. Thereafter, the ohmic electrode 43 is formed in the opening of the insulating film 26. The ohmic electrode 43 is in direct contact with the n-type buffer layer 32 through the opening.

Subsequently, as illustrated in FIGS. 15A to 15D, the lower metal layer 44 of each of the capacitors 14a to 14d is formed on the insulating film 26 disposed on the base layer 49 exposed in the second etching step. The bias line 48 is also formed so as to connect the lower metal layer 44 to the ohmic electrode 43. Thereafter, the insulating film 27 is formed over the substrate 21 having the lower metal layer 44. The lower metal layer 44 has a thickness of about 0.1 µm to 0.2 µm. The insulating film 27 has a thickness of about 0.1 µm to 0.5 µm. The insulating film 27 typically has a thickness of about 0.3 µm so as to set a capacitance of each of the capacitors 14a to 14d to a predetermined value.

Subsequently, as illustrated in FIGS. 16A to 16D, an opening is formed by etching a portion of the insulating films 26 and 27 that is disposed on the mesa structure of each of the light-receiving elements 13a to 13d. The p-type contact layer 38 is exposed through the opening in the insulating films 26 and 27 disposed on the mesa structure of each of the light-receiving elements 13a to 13d. The ohmic electrode 39 is formed on the exposed p-type contact layer 38. The ohmic electrode 39 is in direct contact with the p-type contact layer 38 through the opening in the insulating films 26 and 27. Each of the upper metal layers 45 of the capacitors 14a to 14d is formed on the insulating film 27. The upper metal layer 45 has a thickness of about 0.2 µm to 0.3 µm.

Subsequently, as illustrated in FIGS. 17A to 17D, an opening is formed in a portion of the insulating film 27 that is disposed on the lower metal layer 44, whereby the lower metal layer 44 is exposed. The interconnection pattern 46 is formed so as to extend from an exposed portion of the lower metal layer 44 in the second direction B (refer to FIG. 1). The interconnection pattern 47 is also formed so as to extend from the upper metal layer 45 in the direction opposite to the interconnection pattern 46. The interconnection pattern 42 is also formed so as to extend from the ohmic electrode 39 in the same direction as that of the interconnection pattern 47. Thereafter, each of the electrode pads 17a to 17d is formed on the interconnection pattern 46. Each of the electrode pads 18a to 18d is formed on the interconnection pattern 47. Each of the electrode pads 16a to 16d is formed on the interconnection pattern 42. The optical waveguide receiver 10 is completed through the above steps as illustrated in FIGS. 1 and 2A to 2D.

In the method for manufacturing the optical waveguide receiver 10 according to the present embodiment, the second stacked semiconductor layer section 70 is etched using the etching mask M1, which has the second portions M1b, in the first etching step as described above. By this etching, a portion of the second stacked semiconductor layer section 70 in which one of the capacitors 14a to 14d is formed is remained (FIG. 6). Subsequently, in the second etching step, the remaining portion of the second stacked semiconductor layer section 70 is etched, whereby the semiconductor layer 72 (the base layer 49) forming for the core layer 23 is exposed. This allows the semiconductor layer 72 (the base layer 49), which serves as a base for the capacitors 14a to 14d, to be exposed. Thereafter, in a capacitor-forming step, a MIM structure including the lower metal layer 44, a portion of the insulating film 27, the upper metal layer 45 is formed on the base layer 49 for each of the capacitors 14a to 14d.

In the manufacturing method according to the present embodiment, the MIM structure is formed on the semiconductor layer 72 (the base layer 49). The semiconductor layer 72 (the base layer 49) is also formed for the core layer 23 on the substrate 21 by epitaxial growth method. In general, a surface of a semiconductor layer epitaxially grown on a semiconductor substrate is flatter as compared to a surface of the semiconductor substrate. In the present embodiment, the surface roughness of the semiconductor layer 72 can be adjusted to 0.05 µm or less. The core layer 23 is usually formed of a semiconductor material different from semiconductor materials of other semiconductor layers (the buffer layer 22 and the cladding layer 24) included in the optical waveguides 15a to 15f. Thus, for example, a flat surface of the base layer 49 can be readily exposed by making use of the difference in etching rate between the base layer 49 and the semiconductor layer 75. The base layer 49 serves as an etch stop layer. In this etching process, the semiconductor layer 75 is selectively etched by wet etching using an etching solution containing hydrochloric acid. In the embodiment, the base layer 49 is made of the same material as that of the core layer 23. The semiconductor layer 75 is made of the same material as that of the cladding layer 24. As described above, the manufacturing method and optical waveguide receiver 10 according to the present embodiment allows the flatness of the base face of each of the capacitors 14a to 14d (the MIM structures) to be enhanced. Therefore, the capacitors 14a to 14d have substantially uniform breakdown voltage distribution in the wafer plane. By Experiments, it is proved that a failure in breakdown strength of an MIM structure (MIM capacitor) is increased when a base on which the MIM structure is formed has such irregularities. For example, when the surface roughness of the base is submicron or larger, the failure in breakdown strength of an MIM structure (MIM capacitor) is rapidly increased. For example, a large number of hillocks are formed on a surface of a buried region grown using a slight amount of a dichloroethylene gas in some cases. The surface roughness of the buried region is submicron or larger due to the hillocks. When an MIM structure is formed on the buried region having such large irregularities, an insulating film included in this MIM structure has a thickness distribution. This results in that the capacitance of a capacitor is varied. Alternatively, an electric field concentrates on a thin portion of the insulating film to cause failures such as dielectric breakdown. This applies to the case where an MIM structure is formed on a semiconductor substrate having large irregularities. In the manufacturing method and optical waveguide receiver 10 according to the present embodiment, a base on which the MIM structure is formed has a small surface roughness of tens of nanometers or less. As a result, the MIM structure (MIM capacitor) having high breakdown strength or high breakdown voltage can be achieved. In addition, the present embodiment can provide the optical waveguide receiver 10, which is compact and is excellent in mass producibility.

The semiconductor layer 72 (the base layer 49), which serves as a base for each of the capacitors 14a to 14d, is grown for forming the core layer 23 of each of the optical waveguides 15a to 15f. The semiconductor layer 72 (the base layer 49) is not grown for forming the capacitors 14a to 14d. Thus, the manufacturing method according to the present embodiment can provide flat base faces without forming other semiconductor layers serving as bases for the capacitors 14a to 14d. This allows the increase in number of steps in manufacturing an optical waveguide receiver to be suppressed.

As described in the present embodiment, in order to electrically isolate the light-receiving elements 13a to 13d, the optical waveguides 15a to 15f, and the capacitors 14a to 14d from each other, the substrate 21 exposed after the second etching step by etching the buffer layer 22 and the buried layer 41 around the light-receiving elements 13a to 13d, the optical waveguides 15a to 15f, and the capacitors 14a to 14d. In the etching, the following regions are ensured: regions for forming the electrode pads 16a to 16d, the electrode pads 17a to 17d, and the electrode pads 18a to 18d. This allows the parasitic capacitance of the optical waveguide receiver 10 to be reduced and the high-frequency response thereof to be enhanced.

An optical waveguide receiver and a method for manufacturing an optical waveguide receiver according to the present invention are not limited to those described in the above embodiment and various modifications can be made. For example, in the above embodiment, InGaAsP is used as a material for forming the core layer 23 (as well as the semiconductor layer 72 and the base layer 49). The material for forming the core layer 23 is not limited to InGaAsP. The core layer 23 may be made of another semiconductor material such as AlGaInAs.

In the above embodiment, the semiconductor layers arranged between the substrate 21 and each optical absorption layer 34 are an n-type and the semiconductor layers stacked on the optical absorption layer 34 are a p-type. The semiconductor layers arranged between the substrate 21 and the optical absorption layer 34 may be a p-type and the semiconductor layers stacked on the optical absorption layer 34 may be an n-type.

In a method for manufacturing an optical waveguide receiver according to the present invention, for example, electronic devices such as heterojunction bipolar transistors (HBTs), capacitors different from the capacitors 14a to 14d, and resistors may be formed on the same substrate in addition to the optical waveguides 15a to 15f, light-receiving elements 13a to 13d, and capacitors 14a to 14d described in the above embodiment. This allows photoelectric conversion circuits to be integrated on a single substrate. In the above embodiment, the interconnection pattern 46 and the bias line 48 are connected to the lower metal layer 44 and the interconnection pattern 47 is connected to the upper metal layer 45. However, the interconnection pattern 47 may be connected to the lower metal layer 44 and the interconnection pattern 46 and the bias line 48 may be connected to the upper metal layer 45.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for manufacturing an optical waveguide receiver, the method comprising the steps of:
    growing a first stacked semiconductor layer section for a light-receiving element and a second stacked semiconductor layer section for an optical waveguide on a substrate, the first stacked semiconductor layer section including an optical absorption layer, the second stacked semiconductor layer section including a core layer and a cladding layer disposed on the core layer;
    forming a first mask which includes a first portion covering portions of the first and second stacked semiconductor layer sections and a second portion covering a portion of the second stacked semiconductor layer section in which a capacitor is formed;
    etching the first and second stacked semiconductor layer sections by using the first mask, the first and second stacked semiconductor layer sections covered with the first portion being etched in a stripe-shaped mesa structure, the second stacked semiconductor layer section covered with the second portion being etched in a terrace-shaped structure;
    removing the second portion from the first mask with the first portion left;
    selectively etching the cladding layer covered with the second portion until exposing a surface of the core layer; and
    sequentially forming a first metal layer, an insulating film, and a second metal layer on the core layer exposed in the step of selectively etching the cladding layer, the first metal layer, the insulating film, and the second metal layer constituting the capacitor.

2. The method according to claim 1, wherein the core layer is made of a semiconductor material different from that of the cladding layer disposed on the core layer, and,
    in the step of selectively etching the cladding layer, the cladding layer is etched with an etchant having an etching rate of the cladding layer higher than an etching rate of the core layer.

3. The method according to claim 2, wherein the core layer is made of InGaAsP or AlGaInAs,
    the cladding layer is made of InP, and,
    in the step of selectively etching the cladding layer, the cladding layer is etched by wet etching using an etching solution containing hydrochloric acid as the etchant.

4. The method according to claim 1, wherein the core layer exposed in the step of selectively etching the cladding layer has a surface roughness of 0.05 µm or less.

5. The method according to claim 1, further comprising the steps of:
    forming a second mask on a side face and a top face of the second stacked semiconductor layer section of the stripe-shaped mesa structure after removing the second portion from the first mask; and
    selectively growing a buried layer on a side face of the first stacked semiconductor layer section of the stripe-shaped mesa structure and on a top face and a side face of the terrace-shaped structure by using the first and second masks,
    wherein, in the step of selectively etching the cladding layer, the buried layer and the cladding layer are selectively etched using a mask having an opening located above the cladding layer covered by the second portion of the first mask.

6. The method according to claim 5, wherein, in the step of selectively growing a buried layer, the buried layer is grown by supplying a dichloroethylene gas with a source gas.

7. An optical waveguide receiver comprising:
    a light-receiving element;
    an optical waveguide including a core layer, the optical waveguide being optically coupled to the light-receiving element; and
    a capacitor electrically connected between a reference potential line and a bias line for supplying a bias voltage to the light-receiving element, wherein the light-receiving element, the optical waveguide, and the capacitor are integrated on a substrate, the capacitor includes a base layer, a first metal layer disposed on the base layer, an insulating film disposed on the first metal layer, and a second metal layer disposed on the insulating film, and the base layer of the capacitor is a portion of a semiconductor layer grown for forming the core layer of the optical waveguide.

8. The optical waveguide receiver according to claim 7, wherein the core layer is made of InGaAsP or AlGaInAs, and the optical waveguide further includes a cladding layer disposed on the core layer, the cladding layer being made of InP.

* * * * *